(12) United States Patent
Honda

(10) Patent No.: US 12,143,088 B2
(45) Date of Patent: Nov. 12, 2024

(54) BALUN

(71) Applicant: Murata Manufacturing Co., Ltd., Kyoto (JP)

(72) Inventor: Yuri Honda, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 331 days.

(21) Appl. No.: 17/811,918

(22) Filed: Jul. 12, 2022

(65) Prior Publication Data

US 2023/0013875 A1    Jan. 19, 2023

(30) Foreign Application Priority Data

Jul. 13, 2021    (JP) .................................. 2021-115885

(51) Int. Cl.
| | |
|---|---|
| *H03H 7/42* | (2006.01) |
| *H01L 23/66* | (2006.01) |
| *H01P 5/10* | (2006.01) |
| *H03F 3/21* | (2006.01) |

(52) U.S. Cl.
CPC ................ *H03H 7/42* (2013.01); *H01L 23/66* (2013.01); *H01P 5/10* (2013.01); *H03F 3/21* (2013.01); *H03F 2200/534* (2013.01)

(58) Field of Classification Search
CPC .. H03H 7/42; H03H 7/48; H03H 7/09; H03H 2001/0078; H03H 11/32; H01L 23/66; H01P 5/10; H03F 3/21; H03F 2200/534; H03F 2200/09; H03F 2200/451; H03F 3/195; H03F 2200/541; H03F 3/211
See application file for complete search history.

(56) References Cited

U.S. PATENT DOCUMENTS

| | | | |
|---|---|---|---|
| 9,584,076 B2 | 2/2017 | Ortiz | |
| 2008/0303606 A1* | 12/2008 | Liu | H03H 7/42 |
| | | | 333/25 |
| 2016/0248453 A1 | 8/2016 | Matsuno | |

FOREIGN PATENT DOCUMENTS

JP    2016-158053 A    9/2016

* cited by examiner

*Primary Examiner* — Andrea Lindgren Baltzell
*Assistant Examiner* — Kimberly E Glenn
(74) *Attorney, Agent, or Firm* — Pearne & Gordon LLP

(57) ABSTRACT

A balun includes: first wiring that has a first end connected to a first balanced line and a second end connected to a second balanced line; second wiring that has a grounded first end and a second end; third wiring that has a first end connected to the second end of the second wiring and a second end connected to an unbalanced line and is electromagnetically coupled to the second wiring; a first capacitor that has a first end connected to the first end of the third wiring and a grounded second end; and a second capacitor that has a first end connected to the second end of the third wiring and a grounded second end. The first wiring is electromagnetically coupled to at least one of the second wiring and the third wiring.

19 Claims, 16 Drawing Sheets

BALUN

CROSS REFERENCE TO RELATED APPLICATION

This application claims priority from Japanese Patent Application No. 2021-115885 filed on Jul. 13, 2021. The content of this application is incorporated herein by reference in its entirety.

BACKGROUND ART

The present disclosure relates to a balun.

There is a semiconductor device in which a differential power amplifier, a transmission matching circuit, and a transmission filter are integrated into a one-piece semiconductor integrated circuit (see, for example, Japanese Unexamined Patent Application Publication No. 2016-158053).

U.S. Pat. No. 9,584,076 is also an example of related art.

BRIEF SUMMARY

In the semiconductor device described in Japanese Unexamined Patent Application Publication No. 2016-158053, the transmission matching circuit (balun) that performs impedance conversion and balanced-to-unbalanced conversion on a transmitted signal and the filter that attenuates a signal in a cutoff frequency band are provided subsequently to the differential power amplifier.

However, in the circuit configuration described in Japanese Unexamined Patent Application Publication No. 2016-158053, a change of a load impedance when a subsequent circuit is viewed from an output end of the differential power amplifier with respect to frequency may become large for a fundamental frequency of a radio-frequency (RF) signal. That is, a frequency band which allows successful matching of impedances of the differential power amplifier and the subsequent circuit is narrow.

The present disclosure provides a balun capable of successfully matching impedances of an anterior circuit and a posterior circuit in a wide frequency band.

A balun according to an aspect of the present disclosure includes: first wiring that has a first end connected to a first balanced line, to which one of balanced signals is transmitted, and a second end connected to a second balanced line, to which the other of the balanced signals is transmitted; second wiring that has a grounded first end and a second end; third wiring that has a first end connected to the second end of the second wiring and a second end connected to an unbalanced line, to which an unbalanced signal is transmitted, and is electromagnetically coupled to the second wiring; a first capacitor that has a first end connected to the first end of the third wiring and a grounded second end; and a second capacitor that has a first end connected to the second end of the third wiring and a grounded second end. The first wiring is electromagnetically coupled to at least one of the second wiring and the third wiring.

According to the present disclosure, it is possible to provide a balun capable of successfully matching impedances of an anterior circuit and a posterior circuit in a wide frequency band.

DETAILED DESCRIPTION

Figure 1:
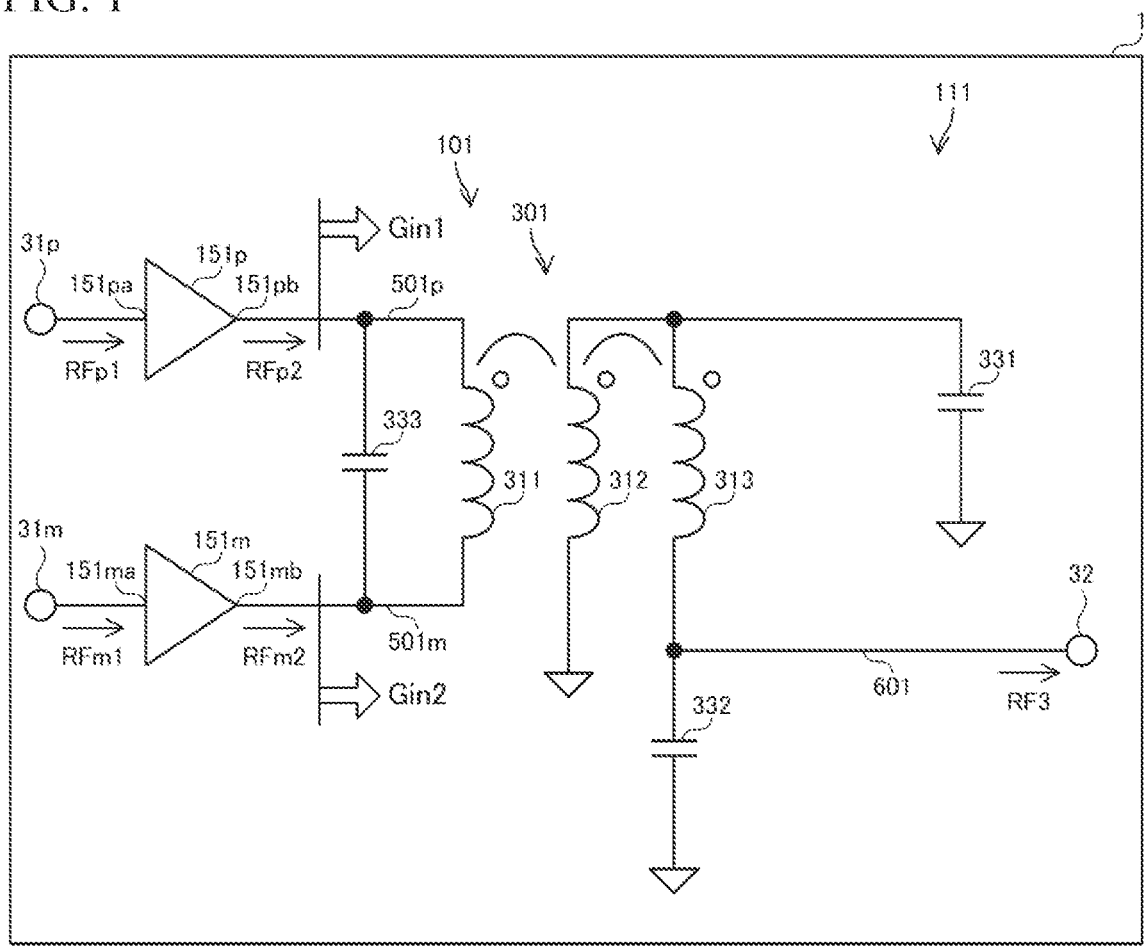
FIG. 1 is a circuit diagram of a power amplifier circuit 111.

Embodiments of the present disclosure will be described below in detail with reference to the drawings. Note that the same elements are denoted by same reference characters and that redundant descriptions will be omitted as much as possible.

First Embodiment

A balun 101 and a power amplifier circuit 111 according to a first embodiment will be described. FIG. 1 is a circuit diagram of the power amplifier circuit 111. As shown in FIG. 1, a semiconductor device 1 includes the power amplifier circuit 111. The semiconductor device 1 is, for example, a semiconductor chip having the formed power amplifier circuit 111. The power amplifier circuit 111 is a circuit which amplifies a radio-frequency balanced signal and outputs an unbalanced signal.

The power amplifier circuit 111 includes the balun 101, amplifiers 151p and 151m, and a capacitor 333. The balun 101 includes a transformer 301, a capacitor 331 (a first capacitor), and a capacitor 332 (a second capacitor). The transformer 301 includes a winding 311 (first wiring), a winding 312 (second wiring), and a winding 313 (third wiring). The amplifiers 151p and 151m constitute, for example, a differential pair at a first stage (a driver stage). The amplifier 151m has substantially the same input-output characteristics as input-output characteristics of the amplifier 151p.

In the present embodiment, the amplifiers 151p and 151m are each composed of, for example, a bipolar transistor, such as a heterojunction bipolar transistor (HBT). Note that the amplifiers 151p and 151m may be each composed of a different transistor, such as a field-effect transistor (metal-oxide-semiconductor field-effect transistor (MOSFET)). In this case, a base, a collector, and an emitter may be read as a gate, a drain, and a source, respectively.

A signal RFp1 which is one of balanced signals and a signal RFm1 which is the other of the balanced signals are input to input terminals 31p and 31m, respectively. A phase of the signal RFp1 is different from a phase of the signal RFm1. In the present embodiment, the phase of the signal RFp1 differs from the phase of the signal RFm1 by approximately 180°. Note that a phase difference may differ greatly from 180°, depending on imbalance between circuit wiring lengths and the like.

The amplifier 151p has an input terminal 151pa which receives the signal RFp1 through the input terminal 31p and an output terminal 151pb which outputs an amplified signal RFp2 obtained by amplifying the signal RFp1. The amplifier 151m has an input terminal 151ma which receives the signal RFm1 through the input terminal 31m and an output terminal 151mb which outputs an amplified signal RFm2 obtained by amplifying the signal RFm1.

One of balanced signals, that is, the amplified signal RFp2 is transmitted to the balun 101 by a balanced line 501p (a first balanced line). The other of the balanced signals, that is, the amplified signal RFm2 is transmitted to the balun 101 by a balanced line 501m (a second balanced line).

The winding 311 in the balun 101 has a first end which is connected to the output terminal 151pb of the amplifier 151p through the balanced line 501p and a second end which is connected to the output terminal 151mb of the amplifier 151m through the balanced line 501m.

The capacitor 333 has a first end which is connected to the first end of the winding 311 and a second end which is connected to the second end of the winding 311. The winding 312 has a grounded first end and a second end and is electromagnetically coupled to the winding 311.

The winding 313 has a first end which is connected to the second end of the winding 312 and a second end and is electromagnetically coupled to the winding 312. The capacitor 331 has a first end which is connected to the first end of the winding 313 and a grounded second end. The capacitor 332 has a first end which is connected to the second end of the winding 313 and a grounded second end.

The amplified signals RFp2 and RFm2 that are balanced signals are converted into an output signal RF3 which is an unbalanced signal by the balun 101 and are output from the second end of the winding 313.

An unbalanced line 601 connects the second end of the winding 313 and an output terminal 32 together. In the unbalanced line 601, the output signal RF3 that is output from the second end of the winding 313 is transmitted to the output terminal 32.

First Reference Example

Figure 2:
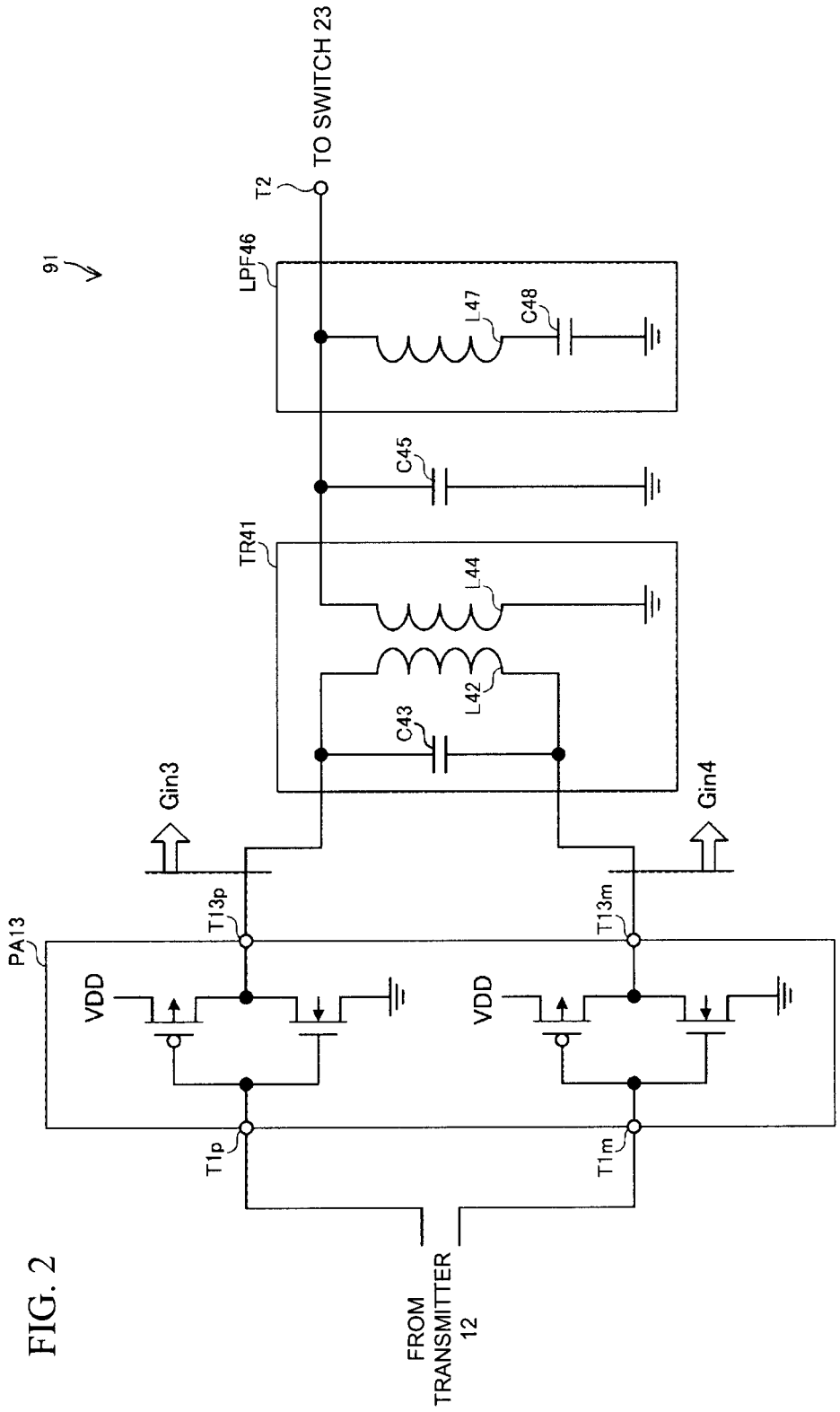
FIG. 2 is a circuit diagram of a power amplifier circuit 91 which is a first reference example.

A power amplifier circuit 91 which is a first reference example will be described. FIG. 2 is a circuit diagram of the power amplifier circuit 91 which is the first reference example. Such a circuit is described in, for example, Japanese Unexamined Patent Application Publication No. 2016-158053. An amplifier PA13 is composed of a differential power amplifier which is a combination of field effect transistors (FETs). The amplifier PA13 has input terminals T1p and T1m which are connected to a transmitter 12, and an output terminal T13p and an output terminal T13m.

A transmission matching circuit TR41 includes an inductor L42 and a capacitor C43 which constitute a balanced side and an inductor L44 which constitutes an unbalanced side. The inductor L42 has a first end which is connected to the output terminal T13p and a second end which is connected to the output terminal T13m. The capacitor C43 is connected between the first end and the second end of the inductor L42. The inductor L44 has a grounded first end and a second end which is connected to a switch 23 through an output terminal T2.

A capacitor C45 has a first end which is connected to the second end of the inductor L44 and a grounded second end. A filter LPF46 includes an inductor L47 and a capacitor C48. The inductor L47 has a first end which is connected to the second end of the inductor L44 and a second end. The capacitor C48 has a first end which is connected to the second end of the inductor L47 and a grounded second end.

[Change of Impedance with Respect to Frequency]

Changes of impedances Gin1 to Gin4 with respect to frequency will be described. Here, the impedances Gin and Gin2 are an impedance when the output terminal 32 is viewed from the output terminal 151pb and an impedance when the output terminal 32 is viewed from the output terminal 151mb, respectively, in the power amplifier circuit 111 (see FIG. 1). The impedances Gin3 and Gin4 are an impedance when the output terminal T2 is viewed from the output terminal T13p and an impedance when the output terminal T2 is viewed from the output terminal T13m, respectively, in the power amplifier circuit 91 (see FIG. 2).

The inventor simulated changes of the impedances Gin1 to Gin4 with respect to frequency, using circuit constants of the circuit elements in the power amplifier circuits 111 and 90 as parameters. The inventor optimized the parameters such that the impedances Gin1 and Gin2 are close to fixed real values in, for example, a frequency range of approximately 1.7 gigahertz (GHz) to 2.7 GHZ. Similarly, the inventor optimized the parameters such that the impedances Gin3 and Gin4 are close to fixed real values in the frequency range.

Figure 3:
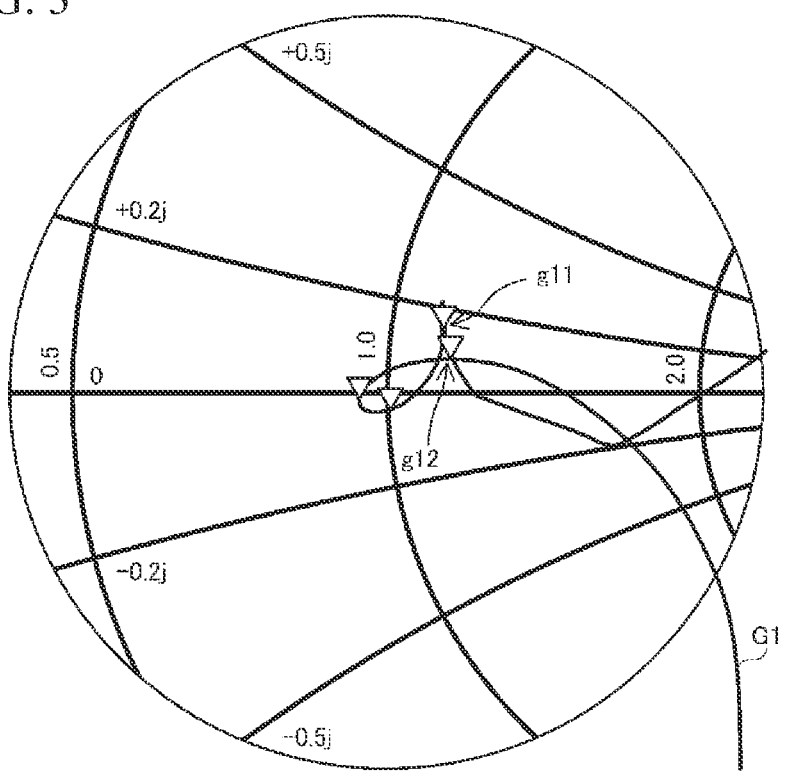
FIG. 3 is a chart showing an example of a simulation result of an impedance Gin1 in the power amplifier circuit 111.
Figure 4:
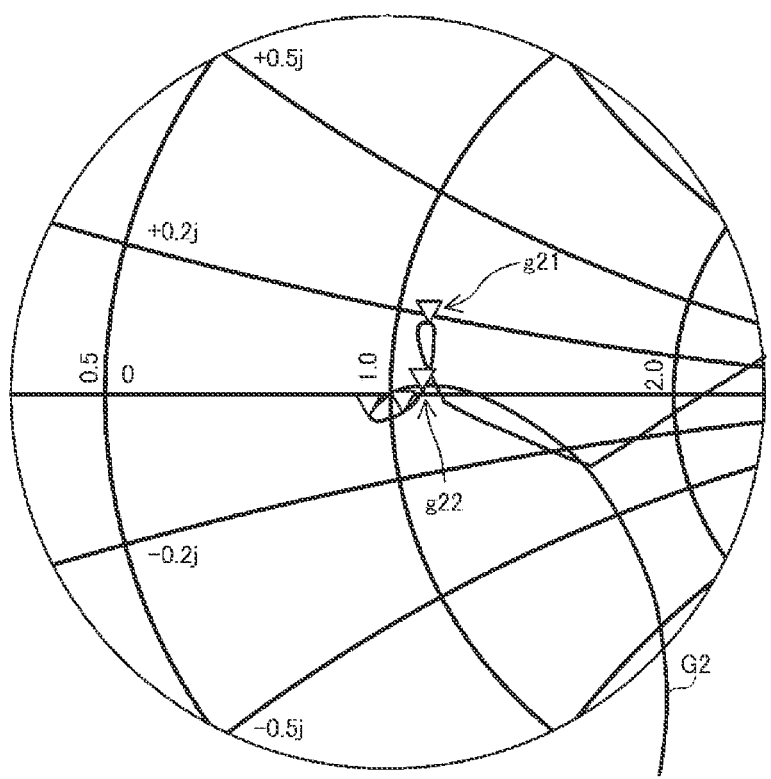
FIG. 4 is a chart showing an example of a simulation result of an impedance Gin2 in the power amplifier circuit 111.

FIGS. 3 and 4 are charts showing respective examples of simulation results of the impedances Gin1 and Gin2 in the power amplifier circuit 111 (see FIG. 1). In FIG. 3, a curve G1 is shown on a Smith chart. The curve G1 shows a change of the impedance Gin1 when a characteristic impedance is set at, for example, 6 ohms in a case where a frequency of the signal RFp1 is changed from 1.2 GHz to 9.0 GHZ. In the curve G1, a change of the impedance Gin1 in the frequency range of 1.7 GHZ to 2.7 GHz is a clockwise trajectory from a position g11 to a position g12.

In FIG. 4, a curve G2 is shown on a Smith chart. The curve G2 shows a change of the impedance Gin2 when a characteristic impedance is set at, for example, 6 ohms in a case where a frequency of the signal RFm1 is changed from 1.2 GHz to 9.0 GHz. In the curve G2, a change of the impedance Gin2 in the frequency range of 1.7 GHZ to 2.7 GHZ is a clockwise trajectory from a position g21 to a position g22.

Figure 5:
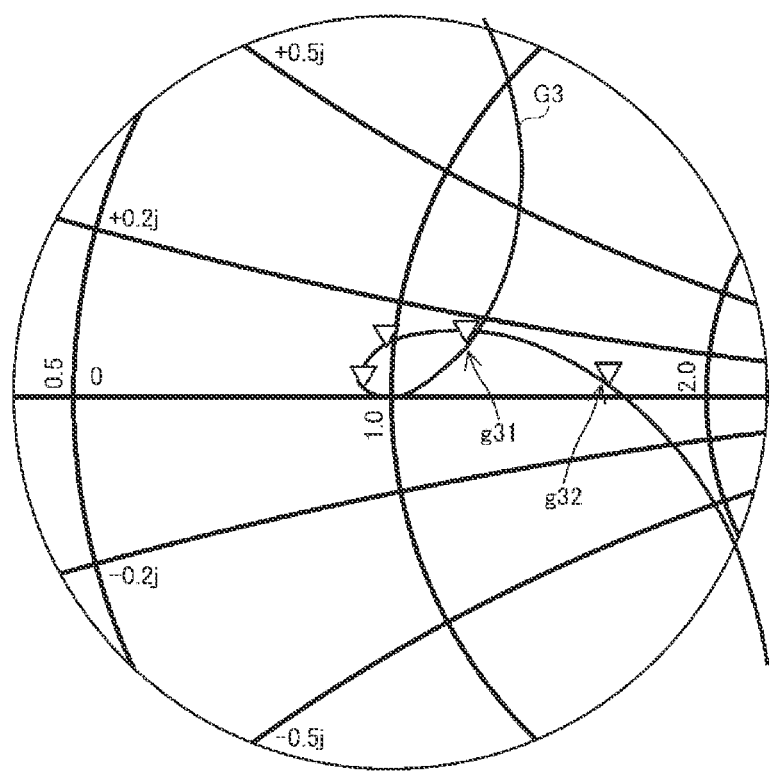
FIG. 5 is a chart showing an example of a simulation result of an impedance Gin3 in the power amplifier circuit 91.
Figure 6:
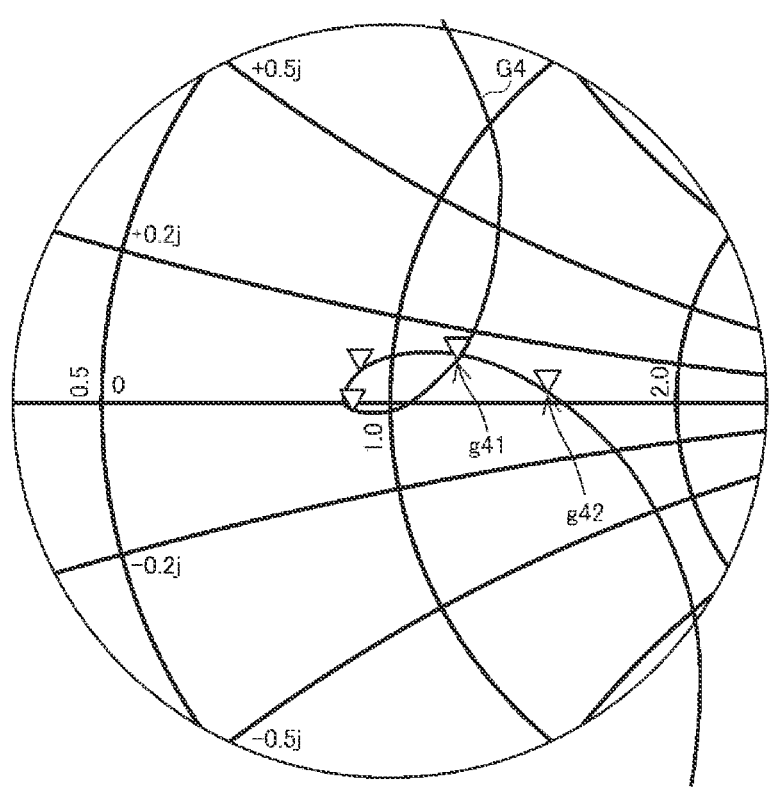
FIG. 6 is a chart showing an example of a simulation result of an impedance Gin4 in the power amplifier circuit 91.

FIGS. 5 and 6 are charts showing respective examples of simulation results of the impedances Gin3 and Gin4 in the power amplifier circuit 91 (see FIG. 2). In FIG. 5, a curve G3 is shown on a Smith chart. The curve G3 shows a change of the impedance Gin3 in a case where a frequency of a signal input to the input terminal T1p is changed from 1.2 GHz to 9.0 GHz. In the curve G3, a change of the impedance Gin3 in the frequency range of 1.7 GHZ to 2.7 GHZ is a clockwise trajectory from a position g31 to a position g32.

In FIG. 6, a curve G4 is shown on a Smith chart. The curve G4 shows a change of the impedance Gin4 in a case where a frequency of a signal input to the input terminal T1m is changed from 1.2 GHz to 9.0 GHz. In the curve G4, a change of the impedance Gin4 in the frequency range of 1.7 GHz to 2.7 GHz is a clockwise trajectory from a position g41 to a position g42.

As shown in FIGS. 3 to 6, in the frequency range of 1.7 GHZ to 2.7 GHZ, the curves G1 and G2 are located closer to centers in the Smith charts than the curves G3 and G4 are. That is, the power amplifier circuit 111 can successfully curb changes of the impedances Gin1 and Gin2 with respect to frequency, as compared with the power amplifier circuit 91.

[Change of Return Loss with Respect to Frequency]

Figure 7:
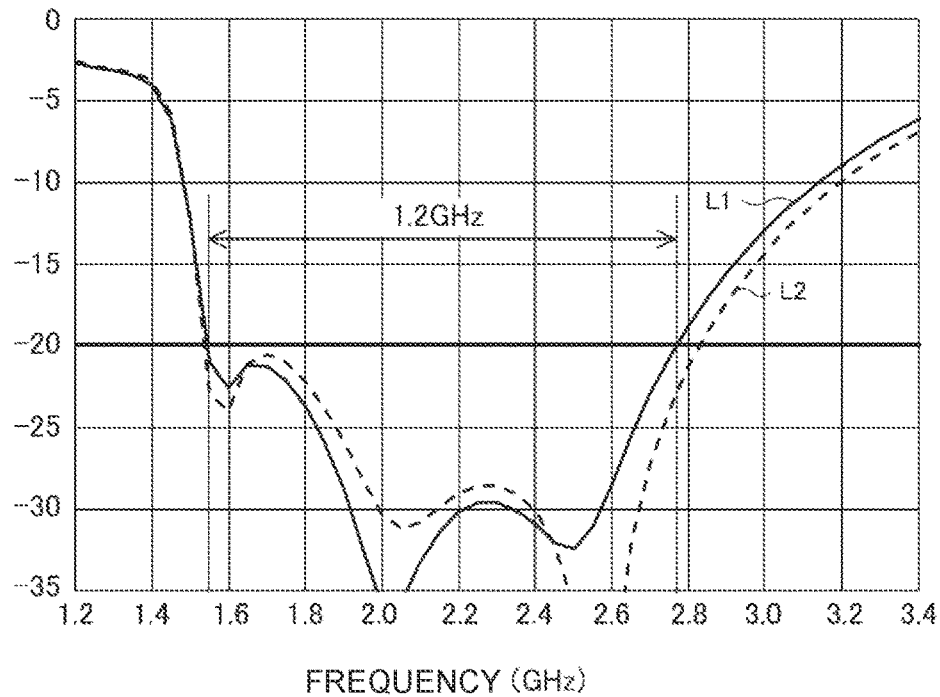
FIG. 7 is a chart showing an example of a simulation result of a return loss in the power amplifier circuit 111.

A change of a return loss at an output terminal of a differential amplifier with respect to frequency will be described. FIG. 7 is a chart showing an example of a simulation result of a return loss in the power amplifier circuit 111 (see FIG. 1). Note that, in FIG. 7, the abscissa represents a frequency in units of "GHz" while the ordinate represents a return loss in units of "dB".

Curves L1 and L2 show changes of return losses at the output terminals 151pb and 151mb, respectively, with respect to frequency. Here, the return loss at the output terminal 151pb is, for example, 20×log (|Gin1|). |Gin1 | represents an absolute value of the impedance Gin1. Similarly, the return loss at the output terminal 151mb is, for example, 20×log (|Gin2|).

The smaller a value of a return loss is, the more successful impedance matching by the balun 101 is. For example, assume that an impedance (notably the impedance Gin1) is successfully matched in a case where a return loss is not more than −20. In the power amplifier circuit 111, the balun 101 can successfully match an impedance in the wide 1.2-GHz-wide frequency range of 1.55 GHz to 2.75 GHz.

Figure 9:
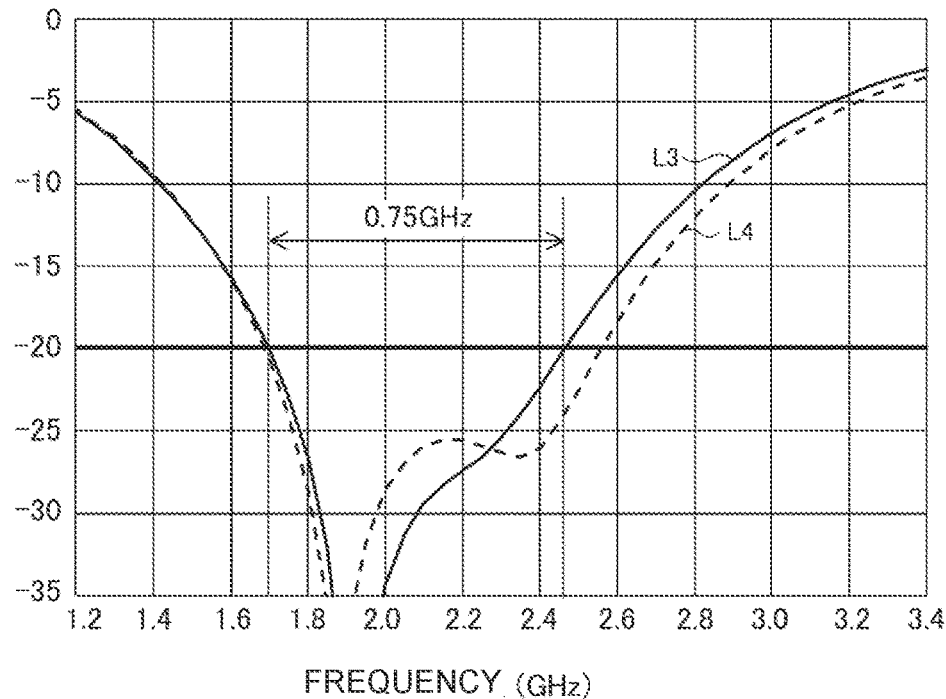
FIG. 9 is a chart showing an example of a simulation result of a return loss in the power amplifier circuit 91.

FIG. 9 is a chart showing an example of a simulation result of a return loss in the power amplifier circuit 91 (see FIG. 2). Note that how to view FIG. 9 is the same as that for FIG. 7.

Curves L3 and L4 show changes of return losses at the output terminals T13p and T13m, respectively, with respect to frequency. The return losses at the output terminals T13p and T13m are, for example, 20×log (|Gin3|) and 20×log (|Gin4|), respectively.

Assuming that an impedance is successfully matched in a case where a return loss is not more than −20, a frequency range which allows successful matching of an impedance (notably the impedance Gin3) is the narrow 0.75-GHz-wide frequency range of 1.7 GHZ to 2.45 GHz in the power amplifier circuit 91. That is, the power amplifier circuit 111 can successfully match an impedance in a wide frequency range, as compared with the power amplifier circuit 91.

[Change of Power Loss with Respect to Frequency]

Figure 8:
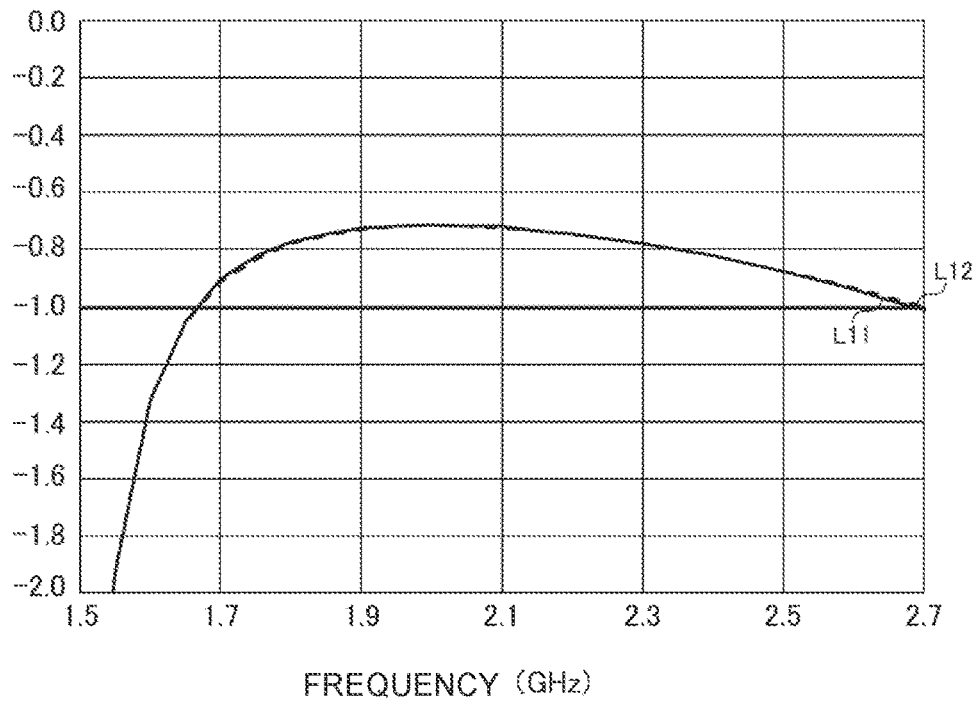
FIG. 8 is a chart showing an example of a simulation result of a power loss in the power amplifier circuit 111.

A change of a power loss between an output terminal of a differential amplifier and an output terminal of a power amplifier circuit with respect to frequency will be described. FIG. 8 is a chart showing an example of a simulation result of a power loss in the power amplifier circuit 111 (see FIG. 1). Note that, in FIG. 8, the abscissa represents a frequency in units of "GHz" while the ordinate represents a power loss in units of "dBm".

A curve L11 shows a change of a power loss between the output terminal 151pb and the output terminal 32 with respect to frequency. Here, the power loss is represented by P1−Pout1+3. P1 and Pout1 are output power from the amplifier 151p and output power from the output terminal 32, respectively.

A curve L12 shows a change of a power loss between the output terminal 151mb and the output terminal 32 with respect to frequency. Here, the power loss is P2−Pout1+3. P2 is output power from the amplifier 151m. Note that P1, P2, and Pout1 are measured in units of "dBm".

Figure 10:
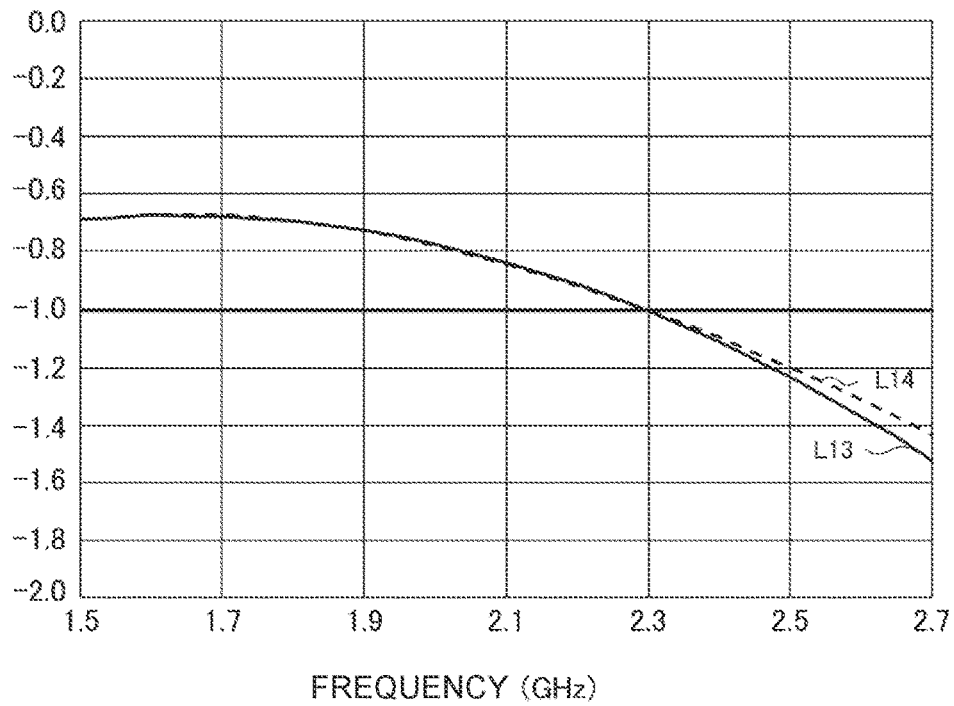
FIG. 10 is a chart showing an example of a simulation result of a power loss in the power amplifier circuit 91.

FIG. 10 is a chart showing an example of a simulation result of a power loss in the power amplifier circuit 91 (see FIG. 2). Note that how to view FIG. 10 is the same as that for FIG. 8.

A curve L13 shows a change of a power loss between the output terminal T13p and the output terminal T2 in the power amplifier circuit 91 with respect to frequency. Here, the power loss is P3-Pout3+3. P3 and Pout3 are output power from the output terminal T13p and output power from the output terminal T2, respectively.

A curve L14 shows a change of a power loss between the output terminal T13m and the output terminal T2 in the power amplifier circuit 91 with respect to frequency. Here, the power loss is P4-Pout3+3. P4 is output power from the output terminal T13m. Note that P3, P4, and Pout3 are measured in units of "dBm".

The larger a value of a power loss is, the more successfully output power from an amplifier is transmitted to an output terminal. In the power amplifier circuit 91, a power loss of about −0.7 dBm can be secured at 1.7 GHZ. However, at a frequency higher than 2.3 GHZ, a power loss falls below −1.0 dBm.

In contrast, in the power amplifier circuit 111, a power loss of not less than approximately-1 dBm can be achieved in the wide frequency range of 1.7 GHZ to 2.7 GHZ.

[Effect of Electromagnetic Coupling between Windings 312 and 313]

Figure 11:
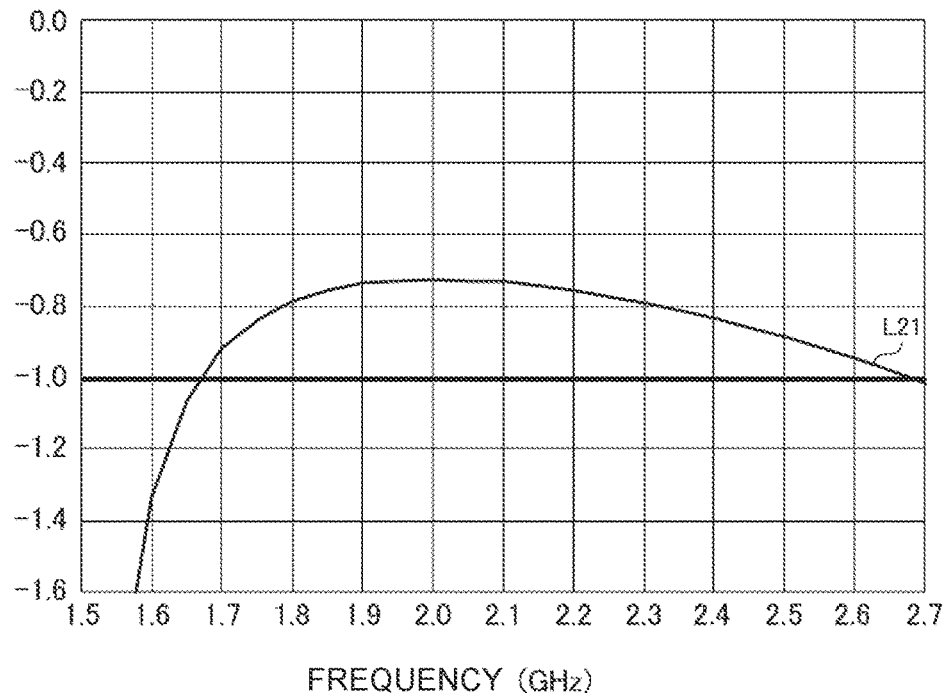
FIG. 11 is a chart showing an example of a simulation result of a total loss in the power amplifier circuit 111.

FIG. 11 is a chart showing an example of a simulation result of a total loss in the power amplifier circuit 111 (see FIG. 1). Note that, in FIG. 11, the abscissa represents a frequency in units of "GHz" while the ordinate represents a total loss in units of "dBm".

As shown in FIG. 11, a curve L21 shows a change of a total loss between the amplifiers 151p and 151m and the output terminal 32 in the power amplifier circuit 111 with respect to frequency. Here, the total loss is P1+P2−Pout1.

Figure 12:
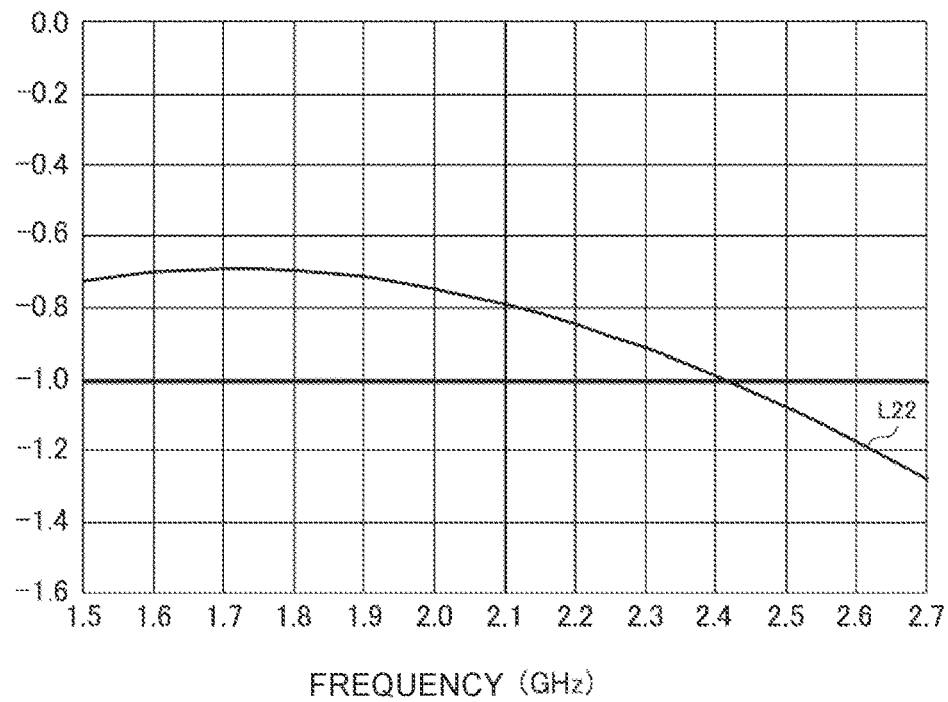
FIG. 12 is a chart showing an example of a simulation result of a total loss in a power amplifier circuit as a second reference example.
Figure 13:
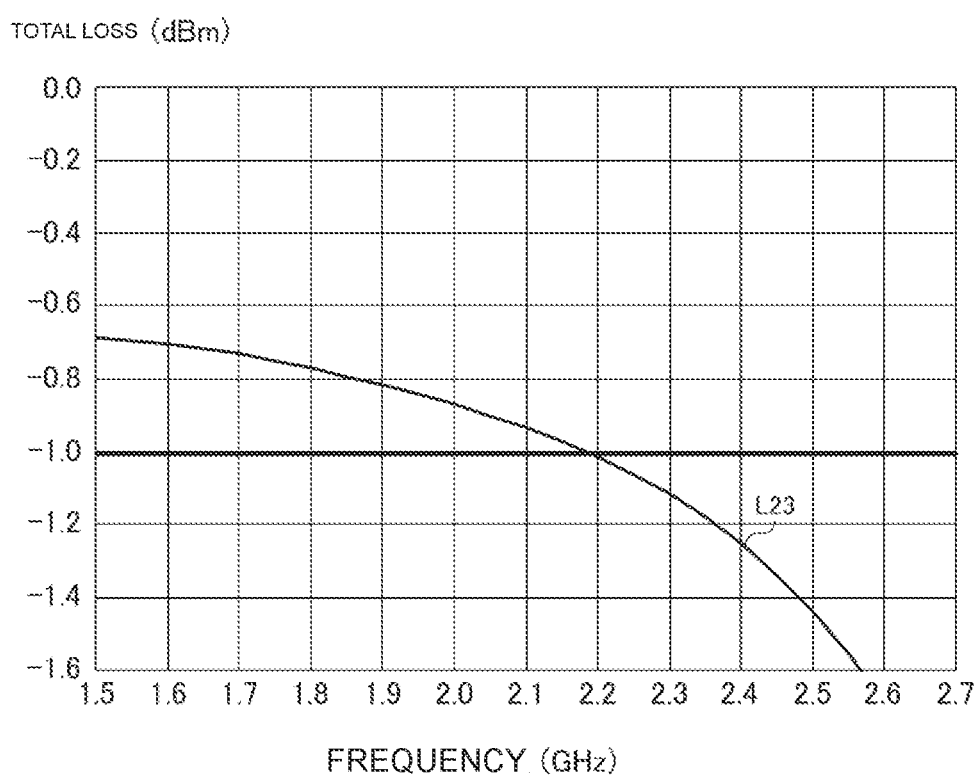
FIG. 13 is a chart showing an example of a simulation result of a total loss in a power amplifier circuit as a third reference example.

FIGS. 12 and 13 are charts showing respective examples of simulation results of total losses in a power amplifier circuit as a second reference example and a power amplifier circuit as a third reference example. Note that how to view FIGS. 12 and 13 is the same as that for FIG. 11. The power amplifier circuit as the second reference example is a circuit obtained by removing the filter LPF46 from the power amplifier circuit 91 shown in FIG. 2. The power amplifier circuit as the third reference example is a circuit obtained by removing electromagnetic coupling between the winding 312 and the winding 313 from the power amplifier circuit 111 shown in FIG. 1.

A curve L22 shown in FIG. 12 shows a change of a total loss in the power amplifier circuit as the second reference example with respect to frequency. A curve L23 shown in FIG. 13 shows a change of a total loss in the power amplifier circuit as the third reference example with respect to frequency.

The larger a value of a power loss is, the more successfully output power from an amplifier is transmitted to an output terminal. As indicated by the curve L22 (see FIG. 12), in the power amplifier circuit as the second reference example, a power loss of about −0.7 dBm can be secured at 1.7 GHZ. However, at a frequency higher than 2.4 GHz, a power loss falls below −1.0 dBm. This is because since a balun in the power amplifier circuit as the second reference example is composed of a transformer with a single stage, a frequency range which allows successful impedance matching by the balun is narrow.

As indicated by the curve L23 (see FIG. 13), in the power amplifier circuit as the third reference example, although a power loss of slightly less than about −0.7 dBm can be secured at 1.7 GHZ, the total loss falls sharply in a frequency region higher than 2.2 GHZ. This is because since a winding 313 and a capacitor 332 in the power amplifier circuit as the third reference example function as a low pass filter, the total loss decreases noticeably on a high-frequency side.

In contrast, in the power amplifier circuit 111, the winding 313 is electromagnetically coupled to the winding 312. Although the winding 313 and the capacitor 332 do not function as a low pass filter, the winding 313 and the capacitor 332 function to widen a frequency range which allows successful impedance matching. For this reason, as indicated by the curve L21 (see FIG. 11), in the power amplifier circuit 111, a total loss of not less than approximately −1 dBm can be achieved in the wide frequency range of 1.7 GHZ to 2.7 GHZ.

Note that although a configuration in which the balun 101 includes the transformer 301 composed of the windings 311, 312, and 313 has been described, the present disclosure is not limited to this. The balun 101 may be configured to include coupled lines which are formed from three transmission lines instead of the transformer 301.

Although a configuration in which the winding 311 and the winding 312 are electromagnetically coupled in the transformer 301 has been described, the present disclosure is not limited to this. The transformer 301 may have a configuration in which the winding 311 and the winding 313 are electromagnetically coupled or a configuration in which the winding 311 is electromagnetically coupled to both the windings 312 and 313. Even a balun including such a transformer can successfully match an impedance in a wide frequency range.

Note that the balun 101 can also be used as an interstage matching balun by being provided between an amplifier at a driver stage and a differential amplifier.

The balun 101 can also be used as an input matching balun for a differential amplifier by being provided between an input terminal and the differential amplifier.

[Layout of Balun 101]

The layout of the balun 101 will be described. Note that the layout of a balun including coupled lines can also be achieved using the same layout as the layout of the balun 101. In each drawing, the x-axis, the y-axis, and the z-axis may be shown. The x-axis, the y-axis, and the z-axis form right-handed three-dimensional Cartesian coordinates. Hereinafter, a direction of an arrow of the z-axis may be referred to as a z-axis+side, and a direction opposite to the arrow may be referred to as a z-axis−side. The same applies to the other axes. Note that the z-axis+side and the z-axis−side may be referred to as an "upper side" and a "lower side", respectively. Here, a direction of clockwise rotation when viewed from the upper side toward the lower side is defined as a clockwise direction cw. A direction of counterclockwise rotation when viewed from the upper side toward the lower side is defined as a counterclockwise direction ccw.

Figure 14:
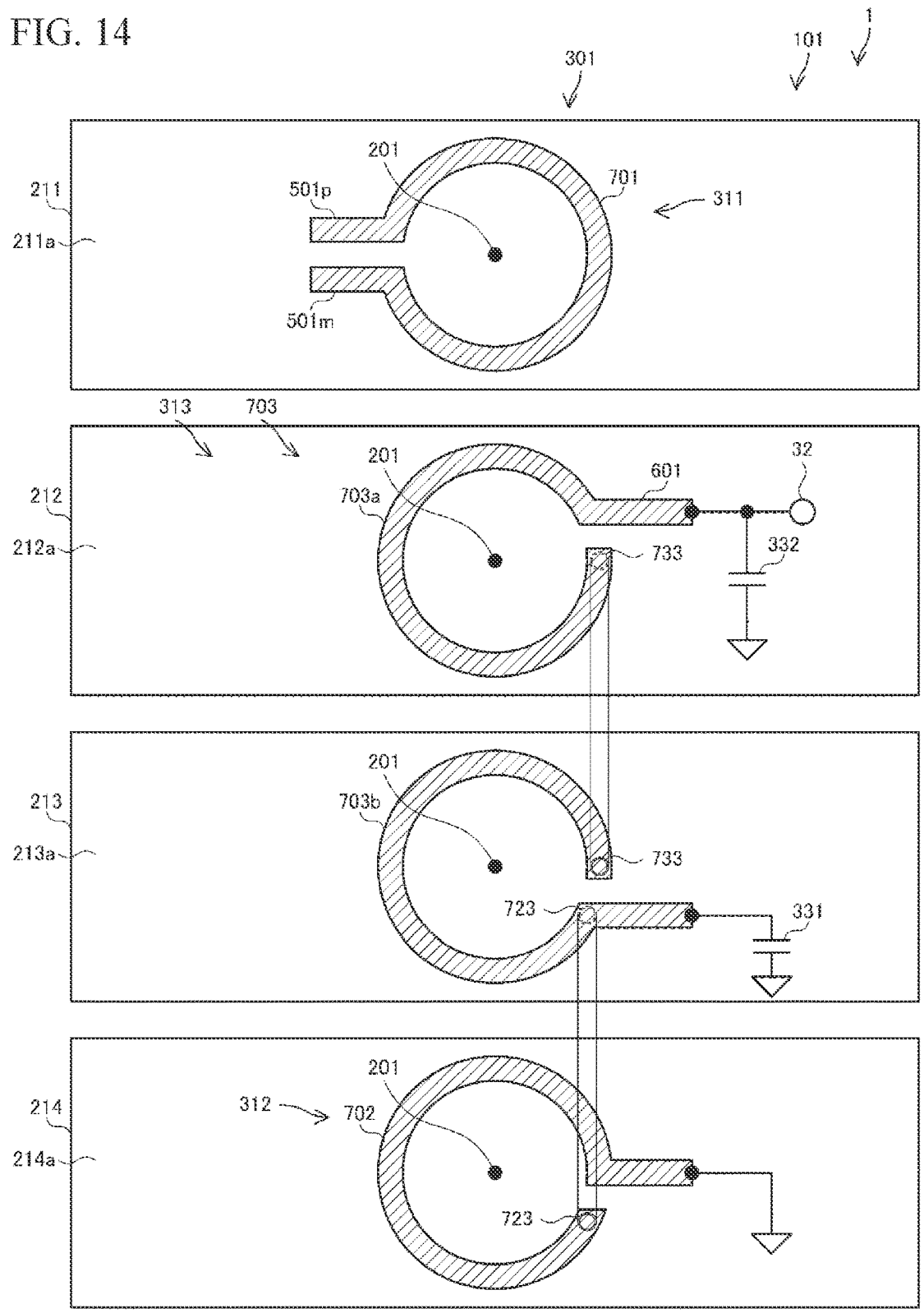
FIG. 14 is a diagram schematically showing a layout of a balun 101.
Figure 14:
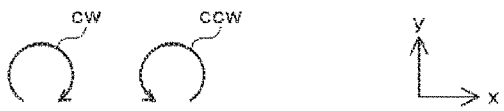

FIG. 14 is a diagram schematically showing a layout of the balun 101. As shown in FIG. 14, the semiconductor device 1 includes, for example, four layers of wiring layers 211, 212, 213, and 214. The wiring layers 211, 212, 213, and 214 are provided in this order from the upper side toward the lower side. Note that the semiconductor device 1 may be configured to include three or less, or five or more wiring layers.

The wiring layers 211, 212, 213, and 214 have a surface 211a (a first surface), a surface 212a (a third surface), a surface 213a (a fourth surface), and a surface 214a (a second surface), respectively. Each of the surface 211a, the surface 212a, the surface 213a, and the surface 214a intersects an axis 201 parallel to the z-axis. In the present embodiment, each of the surface 211a, the surface 212a, the surface 213a, and the surface 214a is assumed to be orthogonal to the axis 201. Note that, for example, a configuration may be adopted in which the surfaces 211a, 212a, 213a, and 214a of the respective wiring layers are not parallel to an xy plane due to, for example, manufacturing variations and these surfaces are substantially parallel to the xy plane, that is, substantially orthogonal to the axis 201.

The winding 311 is formed from metal wiring 701 (a first conductive member) which is wound around the axis 201 on the surface 211a at the wiring layer 211. In the present embodiment, the metal wiring 701 is formed in a C-shape which is open on the x-axis-side when the surface 214a is viewed in plan view along a direction perpendicular to the surface 214a (which may be simply referred to as "when the surface 214a is viewed in plan view"; the same applies to the other surfaces). The metal wiring 701 has a first end which is connected to the balanced line 501p and a second end which is connected to the balanced line 501m. The metal wiring 701 winds along a circumference centered on the axis 201 from the first end to the second end in the clockwise direction cw times, the number of which is not less than ¾ and less than 1.

Although not shown, for example, the amplifiers 151p and 151m are provided on the surface 211a across the balanced lines 501p and 501m from the metal wiring 701. This arrangement allows simple connection of the amplifiers 151p and 151m and the metal wiring 701.

The winding 312 is formed from metal wiring 702 (a second conductive member) which is wound around the axis 201 on the surface 214a at the wiring layer 214. In the present embodiment, the metal wiring 702 is formed in a C-shape which is open on the x-axis+side when the surface 214a is viewed in plan view.

The metal wiring 702 has a grounded first end and a second end which is connected to an interlayer via 723. The metal wiring 702 winds along a circumference centered on the axis 201 from the first end to the second end in the counterclockwise direction ccw times, the number of which is not less than ¾ and less than 1. An outer diameter and an inner diameter of the metal wiring 702 are substantially the same as an outer diameter and an inner diameter, respectively, of the metal wiring 701.

The winding 313 is formed from metal wiring 703 (a third conductive member) which is wound around the axis 201 in a direction opposite to a winding direction of the metal wiring 702. The number of turns of the metal wiring 703 is larger than the number of turns of the metal wiring 702. In the present embodiment, the metal wiring 703 winds around the axis 201 times, the number of which is not less than 1.5 and less than 2.

Here, the expression "the winding direction of the metal wiring 702 and the winding direction of the metal wiring 703 are opposite" means that, when a DC current is passed through the pieces of metal wiring 702 and 703, a direction of the DC current flowing through the metal wiring 702 and a direction of the DC current flowing through the metal wiring 703 are opposite to each other. The expression "the winding direction of the metal wiring 702 and the winding direction of the metal wiring 703 are the same" means that, when a DC current is passed through the pieces of metal wiring 702 and 703, a direction of the DC current flowing through the metal wiring 702 and a direction of the DC current flowing through the metal wiring 703 are the same.

Specifically, the metal wiring 703 includes metal wiring 703a (a first portion) and metal wiring 703b (a second portion). The metal wiring 703a is formed on the surface 212a at the wiring layer 212. In the present embodiment, the metal wiring 703a is formed in a C-shape which is open on the x-axis+side when the surface 212a is viewed in plan view.

The metal wiring 703a has a first end which is connected to an interlayer via 733 and a second end which is connected to the output terminal 32 through the unbalanced line 601 and to the first end of the capacitor 332. The metal wiring 703a winds along a circumference centered on the axis 201 from the first end to the second end in the clockwise direction cw times, the number of which is not less than ¾ and less than 1. An outer diameter and an inner diameter of the metal wiring 703a are substantially the same as the outer diameter and the inner diameter, respectively, of the metal wiring 701.

The metal wiring 703b is formed on the surface 213a at the wiring layer 213. In the present embodiment, the metal wiring 703b is formed in a C-shape which is open on the x-axis+side when the surface 213a is viewed in plan view.

The metal wiring 703b has a first end which is connected to the second end of the metal wiring 702 through the interlayer via 723 and is grounded through the capacitor 331 and a second end which is connected to the first end of the metal wiring 703a through the interlayer via 733. The metal wiring 703b winds along a circumference centered on the axis 201 from the first end to the second end in the clockwise direction cw times, the number of which is not less than ¾ and less than 1. An outer diameter and an inner diameter of the metal wiring 703b are substantially the same as the outer diameter and the inner diameter, respectively, of the metal wiring 701.

When the surface 211a is viewed in plan view from the upper side (viewed in plan view along a direction perpendicular to the surface 211a), the metal wiring 701, the metal wiring 702, the metal wiring 703a, and the metal wiring 703b overlap at least partially with one another. Specifically, when the surface 211a is viewed in plan view from the upper side, an area (which may be referred to as a first overlap area hereinafter) of a portion where the metal wiring 701 overlaps with the metal wiring 702, 703a, or 703b is not less than 50% of an area of the metal wiring 701. The first overlap area can be not less than 60% of the area of the metal wiring 701. In the present embodiment, the first overlap area is not less than 75% of the area of the metal wiring 701.

The above-described layout of the pieces of metal wiring 701, 702, 703a, and 703b and the interlayer vias 723 and 733 makes it possible to reduce an area of arrangement of the windings 311, 312, and 313 when viewed from the upper side. That is, the balun 101 with a wide frequency band can be compactly formed.

Note that although a configuration in which the wiring layers 211, 212, 213, and 214 are provided in this order from the upper side toward the lower side has been described, the present disclosure is not limited to this. An order in which the wiring layers 211, 212, 213, and 214 are provided is not limited to the order, and the wiring layers 211, 212, 213, and 214 may be interchanged. Even if the order in which the wiring layers 211, 212, 213, and 214 are provided is changed, the balun 101 with a wide frequency band can be compactly formed.

Although a configuration in which the whole of the winding 311 is formed on the surface 211a has been described, the present disclosure is not limited to this. A part of the winding 311 may be formed on the surface 211a, and the rest of the winding 311 may be formed on a different surface.

Although a configuration in which the whole of the winding 312 is formed on the surface 214a has been described, the present disclosure is not limited to this. A part of the winding 312 may be formed on the surface 214a, and the rest of the winding 312 may be formed on a different surface.

[Layout of Balun 101A]

Figure 15:
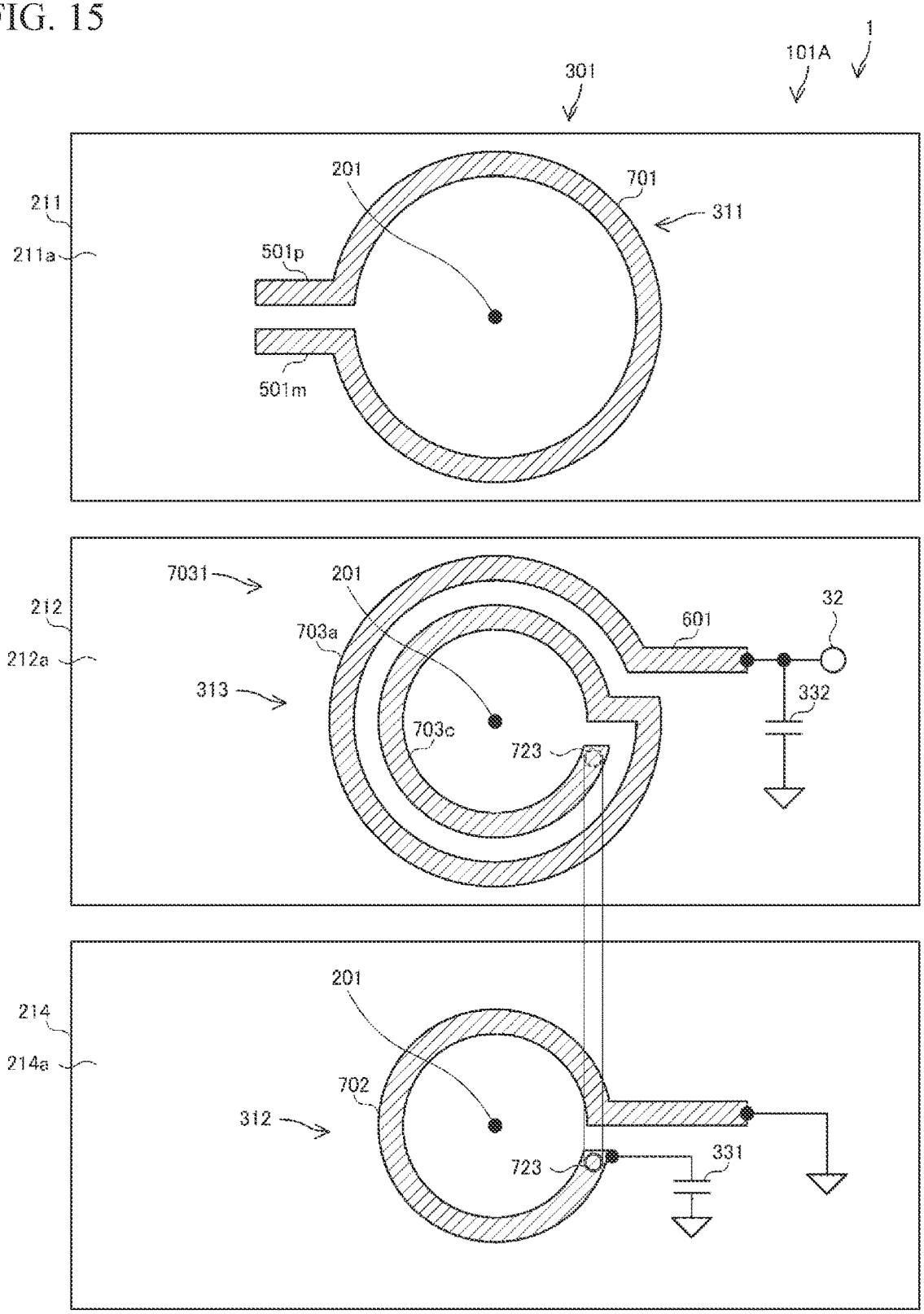
FIG. 15 is a diagram schematically showing a layout of a balun 101A.
Figure 15:

A balun 101A which is a first modification of the balun 101 shown in FIG. 14 will be described. FIG. 15 is a diagram schematically showing a layout of the balun 101A. As shown in FIG. 15, the balun 101A is different from the balun 101 in that the winding 313 is formed from metal wiring which is provided on one surface.

In the present modification, the semiconductor device 1 includes, for example, three layers of the wiring layers 211, 212, and 214. The wiring layers 211, 212, and 214 are provided in this order from an upper side toward a lower side. Note that the semiconductor device 1 may be configured to include four or more wiring layers.

An outer diameter of the metal wiring 702 is smaller than an inner diameter of the metal wiring 701. A second end of the metal wiring 702 is connected to the interlayer via 723 and is connected to a first end of the capacitor 331.

Metal wiring 7031 (a third conductive member) is formed on the surface 212a of the wiring layer 212. The metal wiring 7031 includes the metal wiring 703a (a first portion) and metal wiring 703c (a second portion). The metal wiring 703c is formed in a C-shape which is open on an x-axis+side when the surface 212a is viewed in plan view.

The metal wiring 703c has a first end which is connected to the second end of the metal wiring 702 through the interlayer via 723 and a second end. The metal wiring 703c winds along a circumference centered on the axis 201 from the first end to the second end in the clockwise direction cw times, the number of which is not less than ¾ and less than 1. An outer diameter and an inner diameter of the metal wiring 703c are substantially the same as the outer diameter and the inner diameter, respectively, of the metal wiring 702.

The metal wiring 703a has the same configuration as the metal wiring 703a in the balun 101 shown in FIG. 14. A first end of the metal wiring 703a is connected to the second end of the metal wiring 703c. The metal wiring 703a winds outside the metal wiring 703c along a circumference centered on the axis 201 from the first end to a second end in the clockwise direction cw times, the number of which is not less than ¾ and less than 1. An outer diameter and an inner diameter of the metal wiring 703a are substantially the same as the outer diameter and the inner diameter, respectively, of the metal wiring 701.

When the surface 211a is viewed in plan view from the upper side, the metal wiring 701 and the metal wiring 703a overlap partially with each other. Specifically, when the surface 211a is viewed in plan view from the upper side, an area (which may be referred to as a second overlap area hereinafter) of a portion where the metal wiring 701 overlaps with the metal wiring 703a is not less than 50% of an area of the metal wiring 701. The second overlap area can be not less than 60% of the area of the metal wiring 701. In the present embodiment, the second overlap area is not less than 75% of the area of the metal wiring 701.

When the surface 211a is viewed in plan view from the upper side, the metal wiring 702 and the metal wiring 703c overlap partially with each other. Specifically, when the surface 211a is viewed in plan view from the upper side, an area (which may be referred to as a third overlap area hereinafter) of a portion where the metal wiring 702 overlaps with the metal wiring 703c is not less than 50% of an area of the metal wiring 702. The third overlap area can be not less than 60% of the area of the metal wiring 702. In the present embodiment, the third overlap area is not less than 75% of the area of the metal wiring 702.

The above-described layout of the pieces of metal wiring 701, 702, 703a, and 703c and the interlayer via 723 makes it possible to achieve the balun 101A having the same electrical characteristics as the balun 101 (see FIG. 14) with the number of wiring layers smaller than the number of wiring layers of the balun 101.

Note that although a configuration in which the wiring layers 211, 212, and 214 are provided in this order from the upper side toward the lower side has been described, the present disclosure is not limited to this. An order in which the wiring layers 211, 212, and 214 are provided is not limited to the order, and the wiring layers 211, 212, and 214 may be interchanged.

[Layout of Balun 101B]

Figure 16:
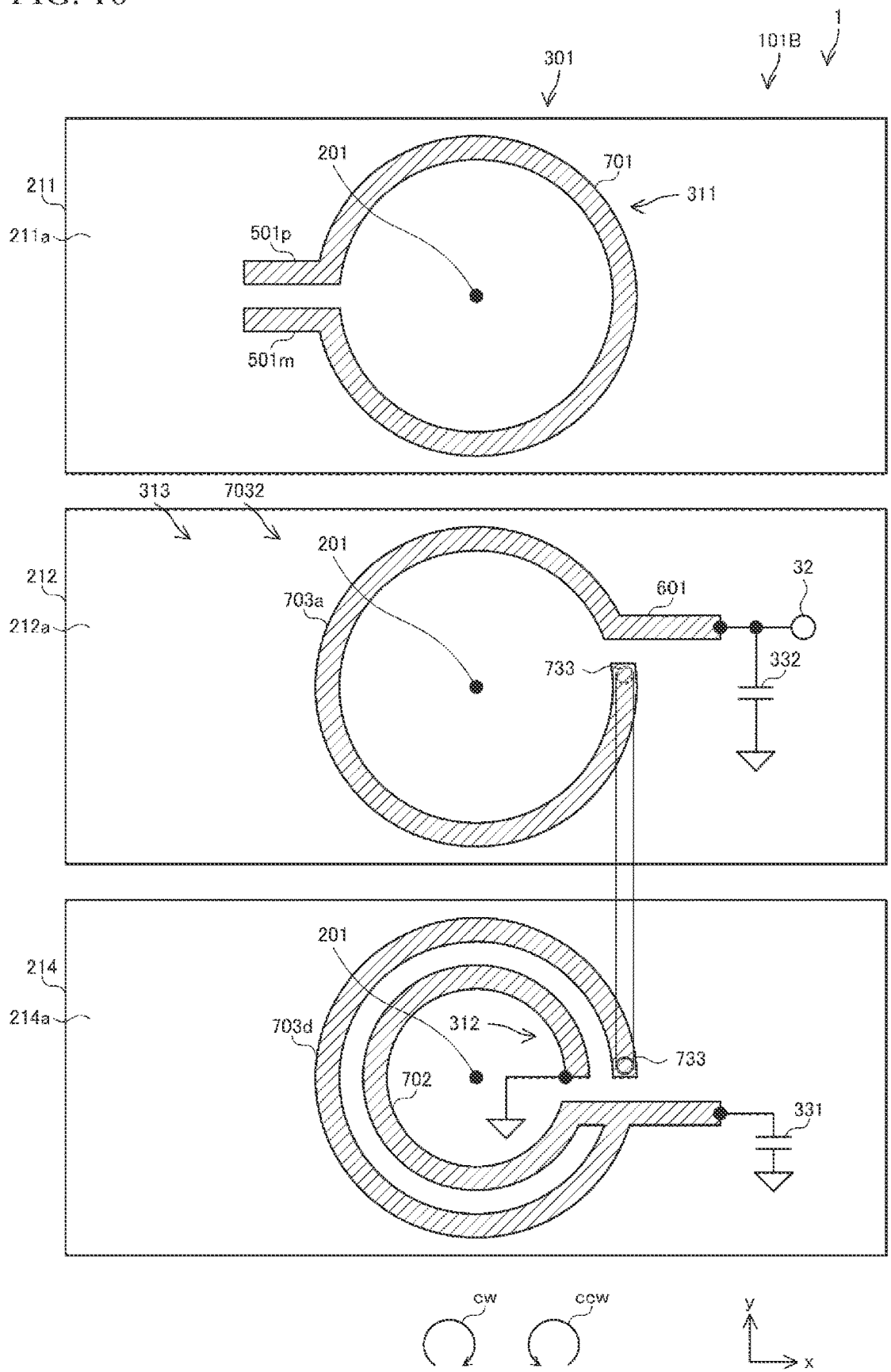
FIG. 16 is a diagram schematically showing a layout of a balun 101B.

A balun 101B which is a second modification of the balun 101 shown in FIG. 14 will be described. FIG. 16 is a diagram schematically showing a layout of the balun 101B. As shown in FIG. 16, the balun 101B is different from the balun 101 in that the winding 312 and a part of the winding 313 are formed from metal wiring which is provided on one surface.

In the present modification, the semiconductor device 1 includes, for example, three layers of the wiring layers 211, 212, and 214. The wiring layers 211, 212, and 214 are provided in this order from an upper side toward a lower side. Note that the semiconductor device 1 may be configured to include four or more wiring layers.

An outer diameter of the metal wiring 702 is smaller than an inner diameter of the metal wiring 701. A second end of the metal wiring 702 is connected to a first end of the capacitor 331.

The winding 313 is formed of metal wiring 7032 which extends across the wiring layers 212 and 214 and winds around the axis 201 times, the number of which is not less than 1.5 and less than 2. Specifically, the metal wiring 7032 includes the metal wiring 703a (a first portion) that is formed on the surface 212a and metal wiring 703d (a second portion) which is formed on the surface 214a.

The metal wiring 703d is formed in a C-shape which is open on an x-axis+side outside the metal wiring 702 when the surface 214a is viewed in plan view. The metal wiring 703d has a first end which is connected to the second end of the metal wiring 702 and a second end which is connected to the interlayer via 733. The metal wiring 703d winds along a circumference centered on the axis 201 from the first end to the second end in a clockwise direction cw times, the number of which is not less than ¾ and less than 1. An outer diameter and an inner diameter of the metal wiring 703d are substantially the same as the outer diameter and the inner diameter, respectively, of the metal wiring 701.

The metal wiring 703a is provided on the surface 212a of the wiring layer 212, as in the balun 101 shown in FIG. 14. An outer diameter and an inner diameter of the metal wiring 703a are substantially the same as the outer diameter and the inner diameter, respectively, of the metal wiring 701.

When the surface 211a is viewed in plan view from the upper side, the metal wiring 701, the metal wiring 703a, and the metal wiring 703d overlap partially with one another. Specifically, when the surface 211a is viewed in plan view from the upper side, an area (which may be referred to as a fourth overlap area hereinafter) of a portion where the metal wiring 701 overlaps with the metal wiring 703a or 703d is not less than 50% of an area of the metal wiring 701. The fourth overlap area can be not less than 60% of the area of the metal wiring 701. In the present embodiment, the fourth overlap area is not less than 75% of the area of the metal wiring 701.

The above-described layout of the pieces of metal wiring 701, 702, 703a, and 703d and the interlayer via 733 makes it possible to achieve the balun 101B having the same electrical characteristics as the balun 101 (see FIG. 14) with the number of wiring layers smaller than the number of wiring layers of the balun 101 (see FIG. 14).

Note that although a configuration in which the wiring layers 211, 212, and 214 are provided in this order from the upper side toward the lower side has been described, the present disclosure is not limited to this. An order in which the wiring layers 211, 212, and 214 are provided is not limited to the order, and the wiring layers 211, 212, and 214 may be interchanged.

[Layout of Balun 101C]

Figure 17:
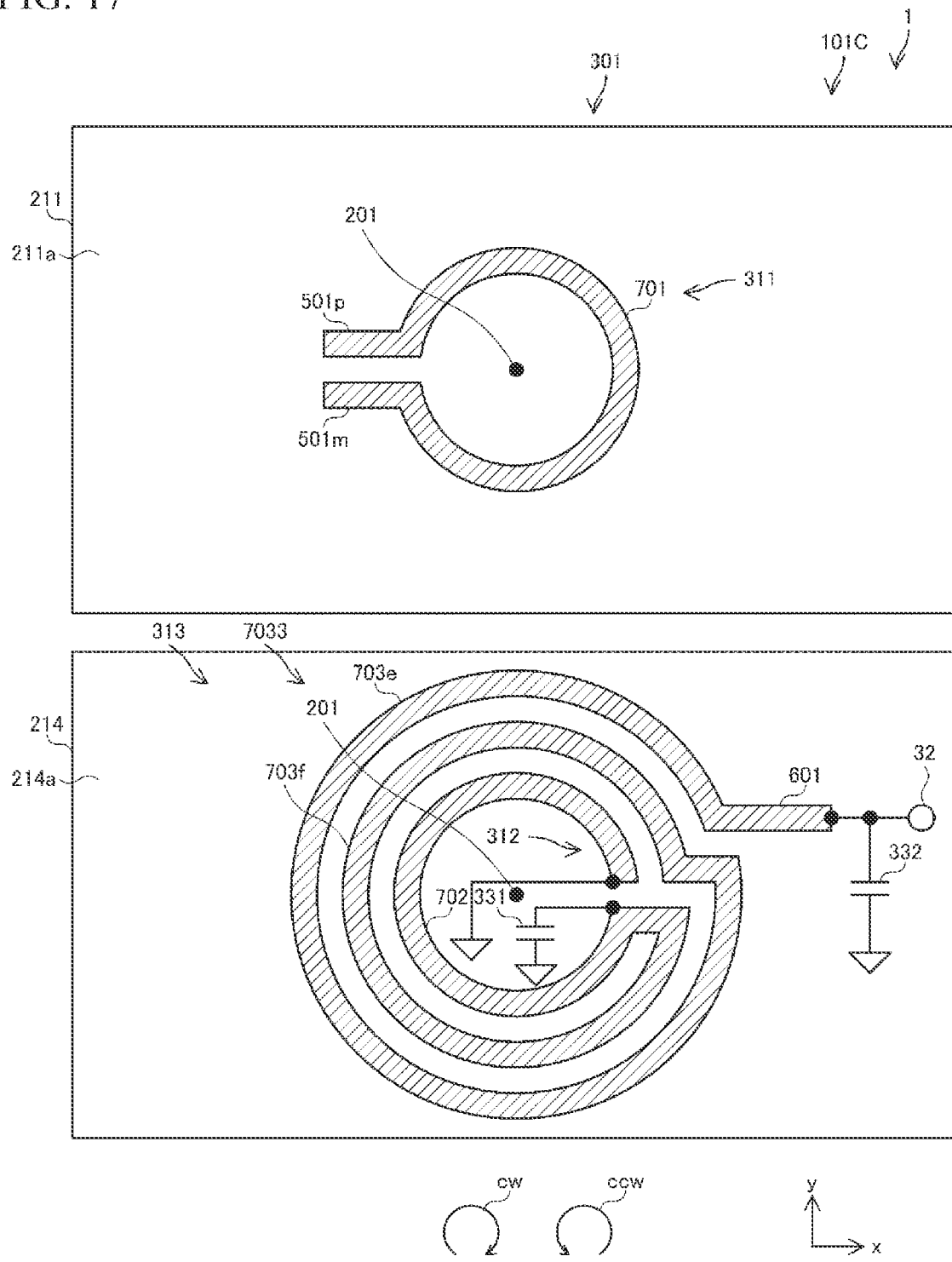
FIG. 17 is a diagram schematically showing a layout of a balun 101C.

A balun 101C which is a third modification of the balun 101 shown in FIG. 14 will be described. FIG. 17 is a diagram schematically showing a layout of the balun 101C. As shown in FIG. 17, the balun 101C is different from the balun 101 in that the windings 312 and 313 are formed from metal wiring which is provided on one surface.

In the present modification, the semiconductor device 1 includes, for example, two layers of the wiring layers 211 and 214. The wiring layers 211 and 214 are provided in this order from an upper side toward a lower side. Note that the semiconductor device 1 may be configured to include three or more wiring layers.

The metal wiring 701 is provided on the surface 211a of the wiring layer 211, as in the balun 101 shown in FIG. 14. The metal wiring 702 is provided on the surface 214a of the wiring layer 214, as in the balun 101 shown in FIG. 14.

In the present modification, an outer diameter and an inner diameter of the metal wiring 702 are substantially the same as an outer diameter and an inner diameter, respectively, of the metal wiring 701. A second end of the metal wiring 702 is connected to a first end of the capacitor 331. Note that the outer diameter of the metal wiring 702 may be different from the outer diameter of the metal wiring 701. The inner diameter of the metal wiring 702 may be different from the inner diameter of the metal wiring 701.

The winding 313 is formed from metal wiring 7033 which winds outside the metal wiring 702 on the surface 214a around the axis 201 times, the number of which is not less than 1.5 and less than 2. Specifically, the metal wiring 7033 includes metal wiring 703e (a first portion) and metal wiring 703f (a second portion).

The metal wiring 703f is formed in a C-shape which is open on an x-axis+side outside the metal wiring 702 when the surface 214a is viewed in plan view. The metal wiring 703f has a first end which is connected to the second end of the metal wiring 702 and a second end. The metal wiring 703f winds along a circumference centered on the axis 201 from the first end to the second end in a clockwise direction cw times, the number of which is not less than ¾ and less than 1.

The metal wiring 703e is formed in a C-shape which is open on an x-axis+side outside the metal wiring 703f when the surface 214a is viewed in plan view. The metal wiring 703e has a first end which is connected to the second end of the metal wiring 703f and a second end which is connected to the output terminal 32 and the first end of the capacitor 332 through the unbalanced line 601. The metal wiring 703e winds along a circumference centered on the axis 201 from the first end to the second end in a clockwise direction cw times, the number of which is not less than ¾ and less than 1.

When the surface 211a is viewed in plan view from the upper side, the metal wiring 701 and the metal wiring 702 overlap partially with each other. Specifically, when the surface 211a is viewed in plan view from the upper side, an area (which may be referred to as a fifth overlap area hereinafter) of a portion where the metal wiring 701 overlaps with the metal wiring 702 is not less than 50% of an area of the metal wiring 701. The fifth overlap area can be not less than 60% of the area of the metal wiring 701. In the present embodiment, the fifth overlap area is not less than 75% of the area of the metal wiring 701.

The above-described layout of the pieces of metal wiring 701, 702, 703e, and 703f makes it possible to achieve the balun 101C having the same electrical characteristics as the balun 101 (see FIG. 14) with the number of wiring layers smaller than the number of wiring layers of the balun 101B (see FIG. 16).

Second Embodiment

Figure 18:
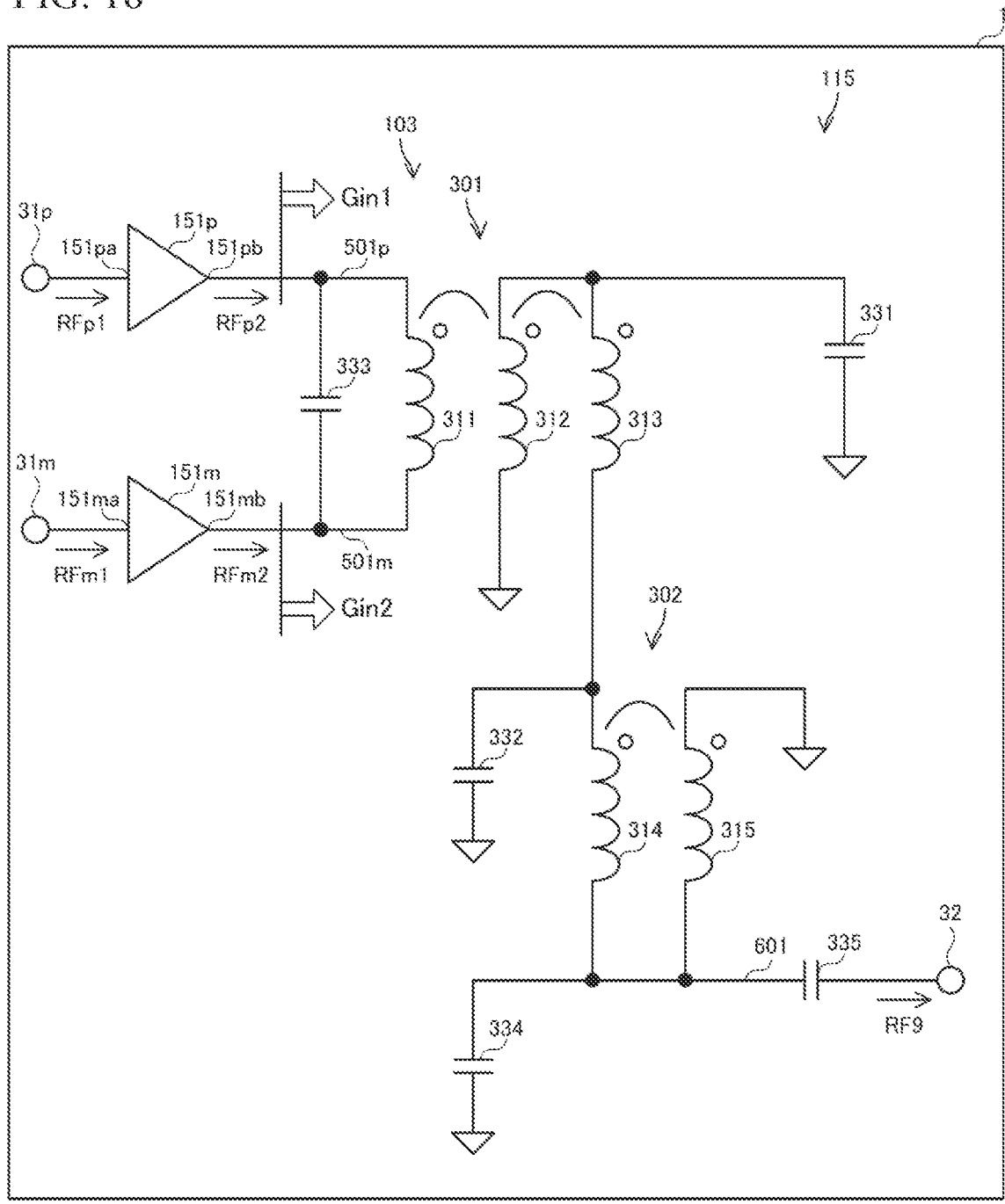
FIG. 18 is a circuit diagram of a power amplifier circuit 115.

A power amplifier circuit 115 according to a third embodiment will be described. FIG. 18 is a circuit diagram of the power amplifier circuit 115. As shown in FIG. 18, the power amplifier circuit 115 according to the third embodiment is different from the power amplifier circuit 111 according to the first embodiment in that the number of transformer stages is larger.

The power amplifier circuit 115 includes a balun 103 instead of a balun 101 and further includes a capacitor 335, as compared with the power amplifier circuit 111 shown in FIG. 1. The balun 103 further includes a transformer 302 and a capacitor 334 (a third capacitor), as compared with the balun 101 shown in FIG. 1. The transformer 302 includes a winding 314 (fourth wiring) and a winding 315 (fifth wiring).

The winding 314 is provided between a second end of a winding 313 and an unbalanced line 601 and has a first end which is connected to the second end of the winding 313 and a second end which is connected to the unbalanced line 601.

The winding 315 has a first end which is connected to the second end of the winding 314 and a grounded second end and is electromagnetically coupled to the winding 314.

The capacitor 334 has a first end which is connected to the second end of the winding 314 and a grounded second end.

The capacitor 335 has a first end which is provided on the unbalanced line 601 and is connected to the second end of the winding 314 and a second end which is connected to an output terminal 32.

The above-described configuration, in which the transformer 302 is further provided subsequently to a transformer 301, makes it possible to widen a frequency range which allows successful impedance matching, as compared with the balun 101 shown in FIG. 1.

Note that although a configuration in which the balun 103 includes electromagnetically-coupled windings has been described, the present disclosure is not limited to this. The balun 103 may be configured to include electromagnetically-coupled transmission lines instead of windings.

[Layout of Balun 103]

The layout of the balun 103 will be described. Note that the layout of a balun obtained by providing transmission lines instead of windings in the balun 103 can also be achieved using the same layout as the layout of the balun 103.

Figure 19:
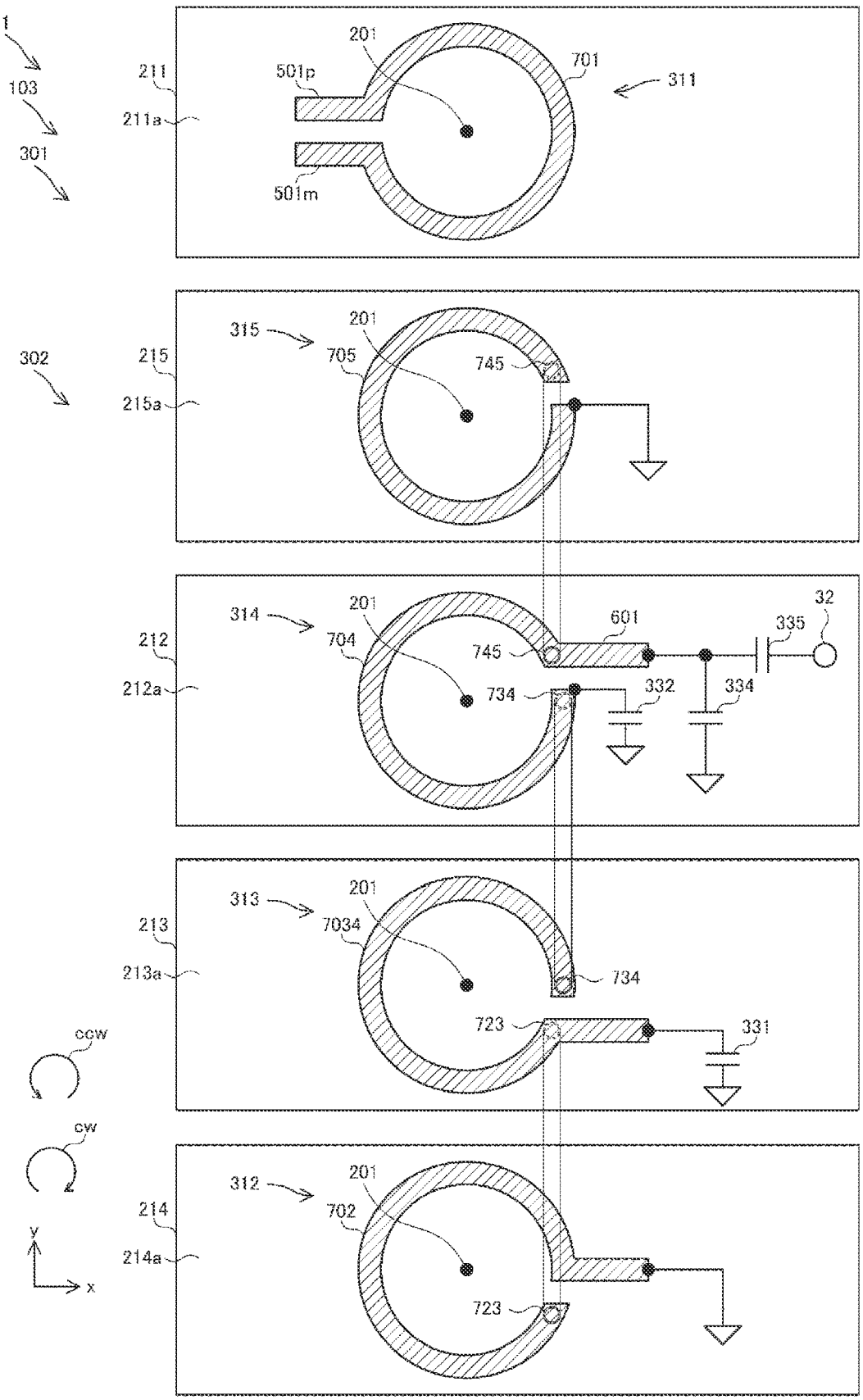
FIG. 19 is a diagram schematically showing a layout of a balun 103.

FIG. 19 is a diagram schematically showing a layout of the balun 103. As shown in FIG. 19, a semiconductor device 1 includes, for example, five layers of wiring layers 211, 212, 213, 214, and 215. The wiring layers 211, 215, 212, 213, and 214 are provided in this order from an upper side toward a lower side. Note that the semiconductor device 1 may be configured to include six or more wiring layers.

The wiring layers 211, 215, 212, 213, and 214 have a surface 211a (a first surface), a surface 215a (a fifth surface), a surface 212a (a fourth surface), a surface 213a (a third surface), and a surface 214a (a second surface), respectively. Each of the surface 211a, the surface 212a, the surface 213a, the surface 214a, and the surface 215a intersects an axis 201 parallel to a z-axis. In the present embodiment, each of the surface 211a, the surface 212a, the surface 213a, the surface 214a, and the surface 215a is orthogonal to the axis 201.

Pieces of metal wirings 701 and 702 are provided on the surface 211a of the wiring layer 211 and the surface 214a of the wiring layer 214, respectively, as in the balun 101 shown in FIG. 14.

Metal wiring 7034 (a third conductive member) is formed on the surface 213a of the wiring layer 213. In the present embodiment, the metal wiring 7034 is formed in a C-shape which is open on an x-axis+side when the surface 213a is viewed in plan view. The metal wiring 7034 has a first end which is connected to a second end of the metal wiring 702 through an interlayer via 723 and is grounded through a capacitor 331 and a second end which is connected to an interlayer via 734. The metal wiring 7034 winds along a circumference centered on the axis 201 from the first end to the second end in the clockwise direction cw times, the number of which is not less than ¾ and less than 1. An outer diameter and an inner diameter of the metal wiring 7034 are substantially the same as the outer diameter and the inner diameter, respectively, of the metal wiring 701.

The winding 314 is formed from metal wiring 704 (a fourth conductive member) which is wound around the axis 201 in a direction opposite to a winding direction of the metal wiring 702 on the surface 212a at the wiring layer 212. In the present embodiment, the metal wiring 704 is formed in a C-shape which is open on the x-axis+side when the surface 212a is viewed in plan view.

The metal wiring 704 has a first end which is connected to the second end of the metal wiring 7034 through the interlayer via 734 and is grounded through a capacitor 332 and a second end which is connected to an interlayer via 745 and is connected to the first end of the capacitor 334 and the first end of the capacitor 335 through the unbalanced line 601. The metal wiring 704 winds along a circumference centered on the axis 201 from the first end to the second end in the clockwise direction cw times, the number of which is not less than ¾ and less than 1. An outer diameter and an inner diameter of the metal wiring 704 are substantially the same as the outer diameter and the inner diameter, respectively, of the metal wiring 701.

The winding 315 is formed from metal wiring 705 (a fifth conductive member) which is wound around the axis 201 in the winding direction of the metal wiring 702 on the surface 215a at the wiring layer 215. In the present embodiment, the metal wiring 705 is formed in a C-shape which is open on the x-axis+side when the surface 215a is viewed in plan view.

The metal wiring 705 has a first end which is connected to the second end of the metal wiring 704 through the interlayer via 745 and a grounded second end. The metal wiring 705 winds along a circumference centered on the axis 201 from the first end to the second end in the counterclockwise direction ccw times, the number of which is not less than ¾ and less than 1. An outer diameter and an inner diameter of the metal wiring 705 are substantially the same as an outer diameter and an inner diameter, respectively, of the metal wiring 701.

When the surface 211a is viewed in plan view from the upper side, the metal wiring 701, the metal wiring 702, the metal wiring 703, the metal wiring 704, and the metal wiring 705 overlap partially with one another.

Specifically, when the surface 211a is viewed in plan view from the upper side, an area (which may be referred to as a sixth overlap area hereinafter) of a portion where the metal wiring 701 overlaps with the metal wiring 702, 703, 704, or 705 is not less than 50% of an area of the metal wiring 701. The sixth overlap area can be not less than 60% of the area of the metal wiring 701. In the present embodiment, the sixth overlap area is not less than 75% of the area of the metal wiring 701.

The above-described layout of the pieces of metal wiring 701, 702, 703, 704, and 705 and the interlayer vias 723, 734, and 745 makes it possible to reduce an area of arrangement of the windings 311, 312, 313, 314, and 315 when viewed from the upper side. That is, the balun 103 with a wider frequency band can be compactly formed.

Note that although a configuration in which the wiring layers 211, 215, 212, 213, and 214 are provided in this order from the upper side toward the lower side has been described, the present disclosure is not limited to this. An order in which the wiring layers 211, 215, 212, 213, and 214 are provided is not limited to the order, and the wiring layers 211, 215, 212, 213, and 214 may be interchanged.

Although a configuration in which the whole of the winding 313 is formed on the surface 213a has been described, the present disclosure is not limited to this. A part of the winding 313 may be formed on the surface 213a, and the rest of the winding 313 may be formed on a different surface.

Although a configuration in which the whole of the winding 314 is formed on the surface 212a has been described, the present disclosure is not limited to this. A part of the winding 314 may be formed on the surface 212a, and the rest of the winding 314 may be formed on a different surface.

Although a configuration in which the whole of the winding 315 is formed on the surface 215a has been described, the present disclosure is not limited to this. A part of the winding 315 may be formed on the surface 215a, and the rest of the winding 315 may be formed on a different surface.

The exemplary embodiments of the present disclosure have been described above. In the balun 101, first wiring has a first end connected to the balanced line 501p, to which one of balanced signals is transmitted, and a second end connected to the balanced line 501m, to which the other of the balanced signals is transmitted. Second wiring has a grounded first end and a second end. Third wiring has a first end connected to the second end of the second wiring and a second end connected to the unbalanced line 601, to which an unbalanced signal is transmitted, and is electromagnetically coupled to the second wiring. The capacitor 331 has a first end connected to the first end of the third wiring and a grounded second end. The capacitor 332 has a first end connected to the second end of the third wiring and a grounded second end. The first wiring is electromagnetically coupled to at least one of the second wiring and the third wiring.

The above-described configuration, in which the second wiring and the third wiring are electromagnetically coupled and the first wiring and at least one of the second wiring and the third wiring are electromagnetically coupled, makes it possible to achieve a balun having the same characteristics as a balun using transformers or coupled lines with two stages. That is, conversion between a balanced signal and a unbalanced signal is performed by the first wiring and at least one of the second wiring and the third wiring, and an impedance conversion circuit is achieved. As compared with the conventional power amplifier circuit 91 (see FIG. 2), the configuration, in which the second wiring and the third wiring and the capacitor 332 are provided instead of the filter LPF46, makes it possible to curb a change of an impedance and a reduction of a power loss for a fundamental frequency of a radio-frequency signal in a still wider frequency band. Thus, a balun capable of successfully matching impedances of an anterior circuit and a posterior circuit can be provided.

In the balun 101, 101A, 101B, 101C, or 103, first wiring is formed from the metal wiring 701 wound around the axis 201. Second wiring is formed from the metal wiring 702 wound around the axis 201. Third wiring is formed from the metal wiring 703, 7031, 7032, 7033, or 7034 wound around the axis 201 in a direction opposite to a winding direction of the metal wiring 702.

The above-described configuration, in which the first wiring, the second wiring, and the third wiring are formed from respective pieces of metal wiring wound around the common axis 201, makes it possible to form each of the baluns 101, 101A, 101B, 101C, and 103 with a small occupied area at a substrate surface while sufficiently securing electromagnetic coupling between pieces of wiring.

In the balun 101, 101A, 101B, or 101C, the number of turns of the metal wiring 703, 7031, 7032, or 7033 is larger than the number of turns of the metal wiring 702.

The above-described configuration makes it possible to, if an impedance of a circuit on a third wiring side is large, successfully match impedances of a circuit on a first wiring side and the circuit on the third wiring side.

In the balun 101, 101A, or 101B, the metal wiring 701 is formed on the surface 211a that intersects the axis 201. The metal wiring 702 is formed on the surface 214a that intersects the axis 201. The metal wiring 703a included in the metal wiring 703, 7031, or 7032 is formed on the surface 212a that intersects the axis 201.

Since the above-described configuration, in which the pieces of metal wiring 701, 702, and 703a are formed on the surfaces 211a, 214a, and 212a, respectively, makes it possible to form the first wiring, the second wiring, and a part of the third wiring with three wiring layers, a thickness of a substrate in which each of the baluns 101, 101A, and 101B is provided can be reduced.

In the balun 101, the metal wiring 703b that is included in the metal wiring 703 and is different from the metal wiring 703a is formed on the surface 213a that intersects the axis 201.

Since the above-described configuration makes it possible to form the balun 101 with four wiring layers, the balun 101 can be compactly formed.

In the balun 101, when the surface 211a is viewed in plan view, the metal wiring 701, the metal wiring 702, the metal wiring 703a, and the metal wiring 703b overlap at least partially with one another.

The above-described configuration makes it possible to sufficiently secure electromagnetic coupling between the first wiring and the second wiring or the third wiring and electromagnetic coupling between the second wiring and the third wiring while curbing an area occupied by the balun 101 when the surface 211a is viewed in plan view.

In the balun 101A, the metal wiring 703c that is included in the metal wiring 7031 and is different from the metal wiring 703a is formed on the surface 212a.

Since the above-described configuration makes it possible to form the balun 101A with three wiring layers, the balun 101A can be formed more compactly than the balun 101. It is also possible to achieve a balun with a small parasitic capacitance between pieces of metal wiring, as compared with a case where the number of turns of the metal wiring 703 is achieved on a plurality of wiring layers.

In the balun 101A, when the surface 211a is viewed in plan view, the metal wiring 701 and the metal wiring 703a overlap partially with each other.

The above-described configuration makes it possible to keep down an area occupied by the balun 101A when the surface 211a is viewed in plan view.

In the balun 101A, when the surface 211a is viewed in plan view, the metal wiring 702 and the metal wiring 703c overlap partially with each other.

The above-described configuration makes it possible to sufficiently secure electromagnetic coupling between the second wiring and the third wiring while keeping down an area occupied by the balun 101A when the surface 211a is viewed in plan view.

In the balun 101B, the metal wiring 703d that is included in the metal wiring 7032 and is different from the metal wiring 703a is formed on the surface 214a.

Since the above-described configuration makes it possible to form the balun 101B with three wiring layers, the balun 101B can be formed more compactly than the balun 101.

In the balun 101B, when the surface 211a is viewed in plan view, the metal wiring 701, the metal wiring 703a, and the metal wiring 703d overlap partially with one another.

The above-described configuration makes it possible to keep down an area occupied by the balun 101B when the surface 211a is viewed in plan view.

In the balun 101C, the metal wiring 701 is formed on the surface 211a that intersects the axis 201. The pieces of metal wirings 702 and 7033 are formed on the surface 214a that intersects the axis 201.

Since the above-described configuration makes it possible to form the balun 101C with two wiring layers, the balun 101C can be formed more compactly than the baluns 101, 101A, and 101B.

In the balun 101C, when the surface 211a is viewed in plan view, the metal wiring 701 and the metal wiring 702 overlap partially with each other.

The above-described configuration makes it possible to sufficiently secure electromagnetic coupling between the first wiring and the second wiring while keeping down an area occupied by the balun 101C when the surface 211a is viewed in plan view.

In the balun 103, fourth wiring is provided between a second end of the third wiring and the unbalanced line 601 and has a first end connected to the second end of the third wiring and a second end connected to the unbalanced line 601. Fifth wiring has a first end connected to the second end of the fourth wiring and a grounded second end and is electromagnetically coupled to the fourth wiring. The capacitor 334 has a first end connected to the second end of the fourth wiring and a grounded second end.

The above-described configuration further including the fourth wiring and the fifth wiring that are electromagnetically coupled makes it possible to achieve a balun having the same characteristics as a balun using transformers or coupled lines with three stages. That is, the configuration is obtained by further providing the balun 101 with the fourth wiring and the fifth wiring and the capacitor 335. This makes it possible to curb a change of an impedance for a fundamental frequency of a radio-frequency signal in a still wider frequency band.

In the balun 103, the first wiring is formed from the metal wiring 701 wound around the axis 201. The second wiring is formed from the metal wiring 702 wound around the axis 201. The third wiring is formed from the metal wiring 7034 wound around the axis 201 in a direction opposite to a winding direction of the metal wiring 702. The fourth wiring is formed from the metal wiring 704 wound around the axis 201 in the opposite direction. The fifth wiring is formed from the metal wiring 705 wound around the axis 201 in the winding direction.

The above-described configuration, in which the first wiring, the second wiring, the third wiring, the fourth wiring, and the fifth wiring are formed from the respective pieces of metal wiring wound around the common axis 201, makes it possible to form the balun 103 with a small occupied area at a substrate surface while sufficiently securing electromagnetic coupling between pieces of wiring.

In the balun 103, the pieces of metal wirings 701, 702, 7034, 704, and 705 are respectively formed on the surfaces 211a, 214a, 213a, 212a, and 215a that intersect the axis 201.

Since the above-described configuration makes it possible to form the first wiring, the second wiring, the third wiring, the fourth wiring, and the fifth wiring with five wiring layers, a thickness of a substrate in which the balun 103 is provided can be reduced.

In the balun 103, when the surface 211a is viewed in plan view, the metal wiring 701, the metal wiring 702, the metal wiring 7034, the metal wiring 704, and the metal wiring 705 overlap partially with one another.

The above-described configuration makes it possible to sufficiently secure electromagnetic coupling between the first wiring and the second wiring or the third wiring, electromagnetic coupling between the second wiring and the third wiring, and electromagnetic coupling between the fourth wiring and the fifth wiring while keeping down an area occupied by the balun 103 when the surface 211a is viewed in plan view.

In the balun 101, the first wiring, the second wiring, and the third wiring are transmission lines.

The above-described configuration makes it possible to easily form coupled lines while sufficiently securing electromagnetic coupling in a frequency band of a radio-frequency signal.

In the balun 101, the first wiring, the second wiring, and the third wiring are the windings 311, 312, and 313, respectively.

The above-described configuration, in which each of the first wiring, the second wiring, and the third wiring is formed from a winding capable of securing a large inductance, makes it possible to sufficiently secure electromagnetic coupling between the first wiring and the second wiring or the third wiring and electromagnetic coupling between the second wiring and the third wiring.

Note that each of the embodiments is described above for facilitating the understanding of the present disclosure, and is not described for limiting the interpretation of the present disclosure. The present disclosure can be modified/improved without necessarily departing from the spirit thereof, and the present disclosure also includes an equivalent thereof. That is, each embodiment whose design is appropriately changed by those skilled in the art is also included in the scope of the present disclosure as long as the embodiment has the features of the present disclosure. For example, elements included in each embodiment and those arrangement, materials, conditions, shapes, sizes, and the like are not limited to those exemplified, and can be appropriately changed. Further, each of the embodiments is exemplary and it goes without necessarily saying that partial substitution or combination of the configurations described in different embodiments can be performed, and this is also included in the scope of the present disclosure as long as the features of the present disclosure are included.

What is claimed is:

1. A balun comprising:
    first wiring that has a first end connected to a first balanced line and a second end connected to a second balanced line, a first balanced signal being transmitted to the first balanced line and a second balanced signal being transmitted to the second balanced line;
    second wiring that has a grounded first end and a second end;
    third wiring that has a first end connected to the second end of the second wiring and a second end connected to an unbalanced line, the third wiring being electromagnetically coupled to the second wiring, and an unbalanced signal being transmitted to the unbalanced line;
    a first capacitor that has a first end connected to the first end of the third wiring and a grounded second end; and
    a second capacitor that has a first end connected to the second end of the third wiring and a grounded second end,
    wherein the first wiring is electromagnetically coupled to the second wiring or the third wiring.

2. The balun according to claim 1, wherein:
    the first wiring is formed from a first conductive member that is wound around an axis,
    the second wiring is formed from a second conductive member that is wound around the axis, and
    the third wiring is formed from a third conductive member that is wound around the axis in a direction opposite to a winding direction of the second conductive member.

3. The balun according to claim 2, wherein a number of turns of the third conductive member is greater than a number of turns of the second conductive member.

4. The balun according to claim 2, wherein:
    at least a part of the first conductive member is formed on a first surface that intersects the axis,
    at least a part of the second conductive member is formed on a second surface that intersects the axis, and
    a first portion of the third conductive member is formed on a third surface that intersects the axis.

5. The balun according to claim 4, wherein a second portion of the third conductive member is formed on a fourth surface that intersects the axis, the second portion being different than the first portion.

6. The balun according to claim 5, wherein when the first surface is viewed in plan view along a direction perpendicular to the first surface, the first conductive member, the second conductive member, the first portion, and the second portion overlap at least partially with one another.

7. The balun according to claim 4, wherein a second portion of the third conductive member is formed on the third surface, the second portion being different than the first portion.

8. The balun according to claim 7, wherein when the first surface is viewed in plan view along a direction perpendicular to the first surface, the first conductive member and the first portion overlap partially with each other.

9. The balun according to claim 7, wherein when the first surface is viewed in plan view along a direction perpendicular to the first surface, the second conductive member and the second portion overlap partially with each other.

10. The balun according to claim 4, wherein a second portion of the third conductive member is formed on the second surface, the second portion being different than the first portion.

11. The balun according to claim 10, wherein when the first surface is viewed in plan view along a direction perpendicular to the first surface, the first conductive member, the first portion, and the second portion overlap partially with one another.

12. The balun according to claim 2, wherein:
    at least a part of the first conductive member is formed on a first surface that intersects the axis, and
    the second conductive member and the third conductive member are formed on a second surface that intersects the axis.

13. The balun according to claim 12, wherein when the first surface is viewed in plan view along a direction perpendicular to the first surface, the first conductive member and the second conductive member overlap partially with each other.

14. The balun according to claim 1, further comprising:
    fourth wiring that is provided between the second end of the third wiring and the unbalanced line, and that has a first end connected to the second end of the third wiring and a second end connected to the unbalanced line;
    fifth wiring that has a first end connected to the second end of the fourth wiring and a grounded second end, the fifth wiring being electromagnetically coupled to the fourth wiring; and
    a third capacitor that has a first end connected to the second end of the fourth wiring and a grounded second end.

15. The balun according to claim 14, wherein:
    the first wiring is formed from a first conductive member that is wound around an axis,
    the second wiring is formed from a second conductive member that is wound around the axis, the third wiring is formed from a third conductive member that is wound around the axis in a direction opposite to a winding direction of the second conductive member, the fourth wiring is formed from a fourth conductive member that is wound around the axis in the opposite direction, and the fifth wiring is formed from a fifth conductive member that is wound around the axis in the winding direction.

16. The balun according to claim 15, wherein at least a part of the first conductive member, at least a part of the second conductive member, at least a part of the third conductive member, at least a part of the fourth conductive member, and at least a part of the fifth conductive member are respectively formed on a first surface, a second surface, a third surface, a fourth surface, and a fifth surface that all intersect the axis.

17. The balun according to claim 16, wherein when the first surface is viewed in plan view along a direction perpendicular to the first surface, the first conductive member, the second conductive member, the third conductive member, the fourth conductive member, and the fifth conductive member overlap partially with one another.

18. The balun according to claim 1, wherein each of the first wiring, the second wiring, and the third wiring is a transmission line.

19. The balun according to claim 1, wherein each of the first wiring, the second wiring, and the third wiring is a winding.

\* \* \* \* \*